(12) United States Patent
Yamazaki

(10) Patent No.: US 8,629,496 B2
(45) Date of Patent: Jan. 14, 2014

(54) SEMICONDUCTOR DEVICE AND METHOD FOR MANUFACTURING THE SAME

(75) Inventor: Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 121 days.

(21) Appl. No.: 13/297,476

(22) Filed: Nov. 16, 2011

(65) Prior Publication Data

US 2012/0132904 A1    May 31, 2012

(30) Foreign Application Priority Data

Nov. 30, 2010 (JP) .................................. 2010-267906

(51) Int. Cl.
*H01L 29/66* (2006.01)
*H01L 21/84* (2006.01)

(52) U.S. Cl.
USPC .......................................... 257/335; 438/162

(58) Field of Classification Search
USPC ...................... 257/64–67, 325, 335, E31.034, 257/E31.047; 438/37, 162
See application file for complete search history.

(56) References Cited

U.S. PATENT DOCUMENTS

| | | | |
|---|---|---|---|
| 5,528,032 A | 6/1996 | Uchiyama | |
| 5,625,202 A | 4/1997 | Chai | |
| 5,731,856 A | 3/1998 | Kim et al. | |
| 5,744,864 A | 4/1998 | Cillessen et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,157,307 B2 | 1/2007 | Ishizaki | |
| 7,211,825 B2 | 5/2007 | Shih et al | |

(Continued)

FOREIGN PATENT DOCUMENTS

EP    1 557 889 A    7/2005
EP    1 737 044 A    12/2006

(Continued)

OTHER PUBLICATIONS

International Search Report (Application No. PCT/JP2010/069872) dated Feb. 8, 2011.

(Continued)

*Primary Examiner* — Calvin Lee
(74) *Attorney, Agent, or Firm* — Eric J. Robinson; Robinson Intellectual Property Law Office, P.C.

(57) ABSTRACT

An object to provide a material suitably used for used for a semiconductor included in a transistor, a diode, or the like, with the use of a sputtering method. Specifically, an object is to provide a manufacturing process an oxide semiconductor film having high crystallinity. By intentionally adding nitrogen to the oxide semiconductor, an oxide semiconductor film having a wurtzite crystal structure that is a hexagonal crystal structure is formed. In the oxide semiconductor film, the crystallinity of a region containing nitrogen is higher than that of a region hardly containing nitrogen or a region to which nitrogen is not intentionally added. The oxide semiconductor film having high crystallinity and having a wurtzite crystal structure is used as a channel formation region of a transistor.

8 Claims, 14 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 * | 6/2010 | Akimoto et al. | 257/72 |
| 7,893,495 B2 | 2/2011 | Li et al. | |
| 7,910,490 B2 | 3/2011 | Akimoto et al. | |
| 8,338,827 B2 | 12/2012 | Yamazaki et al. | |
| 8,378,393 B2 | 2/2013 | Sakata et al. | |
| 8,432,187 B2 * | 4/2013 | Kato et al. | 326/46 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017261 A1 | 1/2005 | Ishizaki | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287221 A1 | 12/2007 | Ong et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0056984 A1 | 3/2008 | Yoshioka et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2009/0283763 A1 | 11/2009 | Park et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0123130 A1 | 5/2010 | Akimoto et al. | |
| 2010/0163874 A1 | 7/2010 | Koyama et al. | |
| 2010/0252832 A1 * | 10/2010 | Asano et al. | 257/57 |
| 2011/0062436 A1 | 3/2011 | Yamazaki et al. | |
| 2011/0068335 A1 | 3/2011 | Yamazaki et al. | |
| 2011/0084271 A1 | 4/2011 | Yamazaki et al. | |
| 2011/0108837 A1 | 5/2011 | Yamazaki et al. | |
| 2011/0127521 A1 | 6/2011 | Yamazaki | |
| 2011/0127522 A1 | 6/2011 | Yamazaki | |
| 2011/0127523 A1 | 6/2011 | Yamazaki | |
| 2011/0127579 A1 | 6/2011 | Yamazaki | |
| 2011/0133180 A1 | 6/2011 | Yamazaki | |
| 2011/0151618 A1 | 6/2011 | Yamazaki et al. | |
| 2012/0132903 A1 | 5/2012 | Yamazaki et al. | |
| 2012/0132905 A1 | 5/2012 | Yamazaki | |

FOREIGN PATENT DOCUMENTS

| | | |
|---|---|---|
| EP | 2 120 267 A | 11/2009 |
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 06-275697 | 9/1994 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-298062 A | 10/2003 |
| JP | 2004-103957 A | 4/2004 |
| JP | 2004-153062 A | 5/2004 |
| JP | 2004-273614 A | 9/2004 |
| JP | 2004-273732 A | 9/2004 |
| JP | 2007-096055 A | 4/2007 |
| JP | 2007-123861 A | 5/2007 |
| JP | 2009-278115 A | 11/2009 |
| WO | 2004/114391 | 12/2004 |
| WO | 2009/034953 | 3/2009 |
| WO | WO 2009/034953 | 3/2009 |

OTHER PUBLICATIONS

Written Opinion (Application No. PCT/JP2010/069872) dated Feb. 8, 2011.

Fortunato et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

(56) References Cited

OTHER PUBLICATIONS

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15$^{th}$ International Display Workshops, Dec. 3, 2008, pp. 1637-1640.

Hayashi et al., "42.1: Invited Paper: Improved Amorphous In-Ga-Zn-O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$-$Ga_2ZnO_4$-$ZnO$ System at 1350° C," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)m$ ($m$ = 3, 4, and 5), $InGaO_3(ZnO)_3$, and $Ga_2O_3(ZnO)m$ ($m$ = 7, 8, 9, and 16) in the $In_2O_3$-$ZnGa_2O_4$-$ZnO$ System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In-Ga-Zn-Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)m$ ($M$=In,Ga; $m$=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$-$In_2O_3$-$ZnO$) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium-Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In-Ga-Zn-Oxide TFTs," IDW '09: Proceedings of the 16$^{th}$ International Display Workshops, 2009, pp. 689-692.

Park et al., "Amorphous Indium-Gallium-Zinc Oxide TFTs and their Application for Large Size AMOLED," AM-FPD'08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Osada et al., "Development of Driver-Integrated Panel using Amorphous In-Ga-Zn-Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In-Ga-Zn-Oxide TFT," SID Digest '09: SID International Symposium Digest of Technical Papers, May 31, 2009, pp. 1110-1112.

Ohara et al., "21.3: 4.0 in. QVGA AMOLED Display Using In-Ga-Zn-Oxide TFTs with a Novel Passivation Layer," SID Digest '09: SID International Symposium Digest of Technical Papers, May 31, 2009, pp. 284-287.

Miyasaka, "58.2: Invited Paper: Suftla Flexible Microelectronics on their Way to Business," SID Digest '07: SID International Symposium Digest of Technical Papers, 2007, vol. 38, pp. 1673-1676.

(56) References Cited

OTHER PUBLICATIONS

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, YbFe$_2$O$_4$, and Yb$_2$Fe$_3$O$_7$ Types of Structures for Compounds in the In$_2$O$_3$ and Sc$_2$O$_3$-A$_2$O$_3$-BO Systems [A: Fe, Ga, or Al; B: Mg, Mn, Fe, Ni, Cu, or Zn] at Temperatures Over 1000° C" Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent InGaZnO$_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review B), Oct. 4, 2007, vol. 76, No. 16, pp. 165202-1-165202-22.

Park et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1245202-6.

Orita et al., "Amorphous transparent conductive oxide InGaO$_3$(ZnO)$_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6th International Display Workshops, Dec. 3, 2008, pp. 581-584.

Kim et al., "High-Performance oxide thin film transistors passivated by various gas plasmas," 214$^{th}$ ECS Meeting, 2008, No. 2317.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on SrTiO$_3$ with Sputtered Al$_2$O$_3$ Gate Insulator," Appl. Phys. Lett. (Applied Physics Letters), Sep. 1, 2003, vol. 83, No. 9, pp. 1755-1757.

* cited by examiner

SEMICONDUCTOR DEVICE AND METHOD FOR MANUFACTURING THE SAME

BACKGROUND OF THE INVENTION

1. Field of the Invention

The present invention relates to a semiconductor device which includes a circuit including at least a semiconductor element such as a transistor as one element, and a manufacturing method thereof. For example, the present invention relates to an electronic device which includes, as a component, a power device mounted in a power circuit; a semiconductor integrated circuit including a memory, a thyristor, a converter, an image sensor, or the like; an electro-optical device typified by a liquid crystal display panel; or a light-emitting display device including a light-emitting element.

Note that the semiconductor device in this specification refers to all devices that can function by utilizing semiconductor characteristics, and electro-optic devices, semiconductor circuits, and electronic appliances are all semiconductor devices.

2. Description of the Related Art

In recent years, attention has been drawn to a technique for forming thin film transistors (TFTs) by using a semiconductor thin film formed over a substrate having an insulating surface. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications.

Some metal oxides have semiconductor characteristics. The examples of such metal oxides having semiconductor characteristics are a tungsten oxide, a tin oxide, an indium oxide, a zinc oxide, and the like. A thin film transistor in which a channel formation region is formed using such metal oxides having semiconductor characteristics is known (Patent Documents 1 and 2).

REFERENCE

Patent Documents

[Patent Document 1] Japanese Published Patent Application No. 2007-123861
[Patent Document 2] Japanese Published Patent Application No. 2007-096055

SUMMARY OF THE INVENTION

One object of an embodiment of the present invention is to provide a material suitably used for a semiconductor included in a transistor, a diode, or the like, with the use of a sputtering method. Specifically, an object is to provide a manufacturing process for forming an oxide semiconductor film having high crystallinity.

Further, an object is to provide a manufacturing process of a semiconductor device, which enables mass production of highly reliable semiconductor devices by using a large substrate such as a mother glass.

By intentionally adding nitrogen to the oxide semiconductor, an oxide semiconductor film having a wurtzite crystal structure that is a hexagonal crystal structure is formed. In the oxide semiconductor film, the crystallinity of a region containing nitrogen is higher than that of a region hardly containing nitrogen or a region to which nitrogen is not intentionally added. The oxide semiconductor film having high crystallinity and having a wurtzite crystal structure is used as a channel formation region of a transistor.

One embodiment of the present invention is a semiconductor device which includes a gate electrode layer, a first insulating layer in contact with the gate electrode layer, an oxide semiconductor layer in contact with the first insulating layer, and a second insulating layer in contact with the oxide semiconductor layer. The oxide semiconductor layer has a wurtzite crystal structure and has a concentration gradient in which the nitrogen concentration is increased as the distance from the first insulating layer becomes shorter. Note that the nitrogen concentration of the oxide semiconductor layer is higher than or equal to $1 \times 10^{17}/cm^3$ and lower than or equal to 20 atomic %, preferably higher than or equal to $1 \times 10^{20}/cm^3$ and lower than 7 atomic %.

As an insulating film in contact with the oxide semiconductor film having a wurtzite crystal structure, an insulating film containing nitrogen, for example, a silicon oxynitride film (also referred to as $SiO_xN_y$, where x>y>0) or a silicon nitride oxide film (also referred to as $SiN_xO_y$, where x>y>0) is preferably used. Note that as the insulating film in contact with the oxide semiconductor film having a wurtzite crystal structure, a silicon oxide film or a stack of a silicon oxide film and a silicon nitride oxide film can also be used. In addition, as the insulating film in contact with the oxide semiconductor film having a wurtzite crystal structure, aluminum oxide, aluminum oxynitride, gallium oxide, hafnium oxide, yttrium oxide, or the like may be used. Note that in the case where nitrogen plasma treatment is performed later when any of these insulating films is used, the thickness or the like of the insulating film is preferably adjusted so that the insulating film sufficiently functions as a gate insulating layer.

In order to increase the nitrogen concentration of the vicinity of an interface between the insulating film and the oxide semiconductor film, nitrogen plasma treatment may be performed, so that nitrogen may be intentionally contained at least in the vicinity of a surface of the insulating film at $1 \times 10^{17}/cm^3$ or more, and an oxide semiconductor film having a wurtzite crystal structure may be formed thereover in a nitrogen atmosphere.

In addition, the oxide semiconductor film having a wurtzite crystal structure is not a single crystal, and the whole of the oxide semiconductor layer is not in an amorphous state. A crystal in the oxide semiconductor layer has an a-b plane which is almost parallel to a surface of the substrate and has bonds forming hexagonal lattices, and has a c-axis which is almost perpendicular to the surface of the substrate.

Alternatively, a stack of oxide semiconductor films having different nitrogen concentrations may be formed in the same chamber by changing a deposition condition stepwise. One embodiment of the present invention is a semiconductor device which includes a gate electrode layer, a first insulating layer in contact with the gate electrode layer, a first oxide semiconductor layer in contact with the first insulating layer, a second oxide semiconductor layer in contact with the first oxide semiconductor layer, and a second insulating layer in contact with the second oxide semiconductor layer. The first oxide semiconductor layer and the second oxide semiconductor layer each have a hexagonal crystal structure, and the first oxide semiconductor layer has a higher nitrogen concentration than the second oxide semiconductor layer.

In the above structure, the nitrogen concentration of the first oxide semiconductor layer is higher than or equal to 0.1 atomic % and lower than 7 atomic %. Further, the nitrogen concentration of the second oxide semiconductor layer is higher than or equal to $1 \times 10^{17}/cm^3$ and lower than $5 \times 10^{19}/cm^3$. The energy gap is small and carriers easily flow in the oxide semiconductor layer in which nitrogen is intentionally contained as compared to an oxide semiconductor layer in which nitrogen is not intentionally contained.

There is no particular limitation on the structure of the transistor including the gate electrode layer, and for example, in the case of a top-gate transistor, a base insulating layer corresponds to the second insulating layer. In the case of the top-gate transistor, an oxide semiconductor layer is provided over the second insulating layer, a first insulating layer that is the gate insulating layer is provided over the oxide semiconductor layer, and a gate electrode layer is provided over the first insulating layer.

Further, a method for manufacturing a top-gate transistor is one embodiment of the present invention, which is a method for manufacturing a semiconductor device including the steps of: forming an insulating film containing nitrogen over a substrate including an insulating surface; introducing the substrate over which the insulating film containing nitrogen is formed, into a vacuum chamber; introducing a nitrogen gas into the vacuum chamber in which a metal oxide target is provided and depositing a first oxide semiconductor film containing nitrogen under a first deposition condition that a substrate temperature is higher than or equal to 150° C. and lower than or equal to 450° C.; and introducing a nitrogen gas into the vacuum chamber and depositing a second oxide semiconductor film containing nitrogen on and in contact with the first oxide semiconductor film under a second deposition condition that the substrate temperature is higher than or equal to 150° C. and lower than or equal to 450° C. According to the manufacturing method, the oxide semiconductor films having high crystallinity can be formed.

In the case of a bottom-gate transistor, a protective insulating layer corresponds to the second insulating layer. In the case of the bottom-gate transistor, a first insulating layer that is a gate insulating layer is provided over a gate electrode layer, an oxide semiconductor layer is provided over the first insulating layer, and the second insulating layer that is the protective insulating layer is provided over the oxide semiconductor layer.

In addition, a method for manufacturing a bottom-gate transistor is one embodiment of the present invention, which is a method for manufacturing a semiconductor device including the steps of: forming a gate electrode layer over a substrate including an insulating surface; forming an insulating film containing nitrogen over the gate electrode layer; introducing a substrate over which the gate electrode layer and the insulating film containing nitrogen are formed, into a vacuum chamber; introducing a nitrogen gas into the vacuum chamber in which a metal oxide target is provided and depositing a first oxide semiconductor film containing nitrogen under a first deposition condition that a substrate temperature is higher than or equal to 150° C. and lower than or equal to 450° C.; and introducing a nitrogen gas into the vacuum chamber and depositing a second oxide semiconductor film containing nitrogen on and in contact with the first oxide semiconductor film under a second deposition condition that the substrate temperature is higher than or equal to 150° C. and lower than or equal to 450° C. According to the manufacturing method, the oxide semiconductor films having high crystallinity can be formed.

In each of the manufacturing methods, heat treatment at a temperature higher than or equal to 150° C. and lower than or equal to 650° C. may be performed in an atmosphere which hardly contains hydrogen and water (a nitrogen atmosphere, an oxygen atmosphere, a dry-air atmosphere (e.g., as for moisture, the dew point is lower than or equal to −40° C., preferably lower than or equal to −60° C.), or the like) after the deposition on the second deposition condition. By performing the heat treatment, the crystallinity of the oxide semiconductor layer can be increased.

In each of the manufacturing methods, a percentage of the flow rate of the nitrogen gas with respect to the total flow rate of a sputtering gas which is introduced into the vacuum chamber is greater than or equal to 82.5%, preferably greater than or equal to 90% and less than or equal to 100%. By adjusting the nitrogen gas flow rate, the nitrogen concentration of the oxide semiconductor layer can be controlled. When the percentage of the gas flow rate of the nitrogen gas is made closer to 100%, the purity and the nitrogen concentration of the oxide semiconductor layer can be increased.

In addition, in each of the manufacturing methods, the nitrogen gas may be introduced into the vacuum chamber while the nitrogen gas is heated under the first deposition condition.

In each of the manufacturing methods, in the case where the first deposition condition is different from the second deposition condition, a sputtering gas which includes an oxygen gas or a rare gas besides the nitrogen gas is introduced under the second deposition condition.

In each of the manufacturing methods, nitrogen plasma treatment may be performed on a surface of the insulating film containing nitrogen after the insulating film containing nitrogen is formed.

In each of the manufacturing methods, the insulating film containing nitrogen is a film formed in such a manner that nitrogen is added to a surface of an insulating film by nitrogen plasma treatment. For example, a silicon oxide film including a surface to which nitrogen is added by nitrogen plasma treatment can be used.

Further, an oxide semiconductor layer having high crystallinity can be formed over a large substrate such as a mother glass. The crystallinity is improved by performing heat treatment after the oxide semiconductor layer is formed by the above method, whereby the oxide semiconductor film having a wurtzite crystal structure that is a hexagonal crystal structure is formed.

Although depending on the first deposition condition and the second deposition condition, an oxide semiconductor film can have a wurtzite crystal structure that is a hexagonal crystal structure just after the deposition. In that case, heat treatment after the deposition of the oxide semiconductor film can be omitted; therefore, the above process is favorable for mass production.

When nitrogen is intentionally contained in the oxide semiconductor layer of the transistor, a wurtzite crystal structure is obtained, so that the crystallinity can be improved. By increasing the crystallinity of the oxide semiconductor layer, the transistor having improved electric characteristics (the field-effect mobility, the threshold voltage, and the like) can be obtained.

Mass production of a highly reliable semiconductor device can be performed with the use of a large substrate such as a mother glass.

DETAILED DESCRIPTION OF THE INVENTION

Figure 1A:
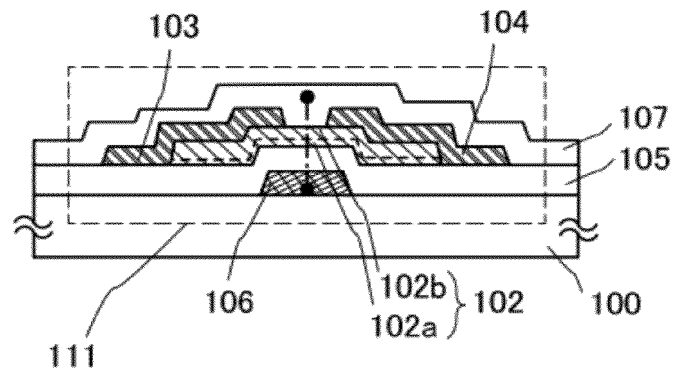
FIGS. 1A to 1D are cross-sectional views each illustrating one embodiment of the present invention.

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

(Embodiment 1)

In this embodiment, an example of a method for manufacturing a bottom-gate transistor illustrated in FIG. 1A will be described below.

First, a gate electrode layer 106 is formed over a substrate 100.

For the substrate 100, a glass material such as aluminosilicate glass, aluminoborosilicate glass, or barium borosilicate glass is used. In mass production, a mother glass with the following size is preferably used for the substrate 100: the 8-th generation (2160 mm×2460 mm); the 9-th generation (2400 mm×2800 mm, or 2450 mm×3050 mm); the 10-th generation (2950 mm×3400 mm); or the like. High process temperature and a long period of process time drastically shrink the mother glass. Thus, in the case where mass production is performed with use of the mother glass, the heating temperature in the manufacturing process is preferably lower than or equal to 600° C., further preferably, lower than or equal to 450° C.

The gate electrode layer 106 is formed using a metal material such as titanium, molybdenum, chromium, tantalum, tungsten, aluminum, or copper, or an alloy material thereof. The gate electrode layer 106 can be formed in such a manner that a conductive film is formed over the substrate 100 by a sputtering method or a vacuum evaporation method; a mask is formed over the conductive film by a photolithography technique or an inkjet method; and the conductive film is etched using the mask.

As a material layer which is provided between the gate electrode layer 106 and a gate insulating layer and in contact with the gate insulating layer, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (InN, ZnN, or the like) is preferably used. These films each have a work function of 5 eV or higher, preferably 5.5 eV or higher; thus, the threshold voltage of the electrical characteristics of the transistor can be made to be positive, so that a so-called normally-off switching element can be realized. For example, in the case where an In—Ga—Zn—O film containing nitrogen is used, an In—Ga—Zn—O film whose nitrogen concentration is higher than or equal to $1 \times 10^{20}/cm^3$ and lower than or equal to 20 atomic %, which is higher than at least the nitrogen concentration of an oxide semiconductor layer 102 formed later, for example, an In—Ga—Zn—O film having a nitrogen concentration of 7 atomic % or more is used.

Next, a gate insulating layer 105 covering the gate electrode layer 106 is formed. As the gate insulating layer 105, an insulating film containing nitrogen, for example, a silicon oxynitride film (also referred to as $SiO_xN_y$, where x>y>0) or a silicon nitride oxide film (also referred to as $SiN_xO_y$, where x>y>0) is preferably used. Note that as the gate insulating layer 105, a silicon oxide film or a stack of a silicon oxide film and a silicon nitride film can also be used.

Next, the oxide semiconductor layer 102 is formed on and in contact with the gate insulating layer 105. The oxide semiconductor layer 102 is deposited with the use of any of an AC sputtering apparatus, a DC sputtering apparatus, and an RF sputtering apparatus. As a material used for the oxide semiconductor layer 102, a four-component metal oxide such as an In—Sn—Ga—Zn—O film; a three-component metal oxide such as an In—Ga—Zn—O film, an In—Sn—Zn—O film, an In—Al—Zn—O film, a Sn—Ga—Zn—O film, an Al—Ga—Zn—O film, or a Sn—Al—Zn—O film; or a two-component metal oxide such as an In—Zn—O film, a Sn—Zn—O film, an Al—Zn—O film, or an In—Ga—O film; or the like can be used. Further, $SiO_2$ may be contained in the above oxide semiconductor. Here, for example, an In—Ga—Zn—O film refers to an oxide film containing indium (In), gallium (Ga), and zinc (Zn).

In addition, at the formation of the oxide semiconductor layer, the pressure of a treatment chamber in the sputtering apparatus is set to less than or equal to 0.4 Pa, whereby entry of impurities such as alkali metal or hydrogen into a surface where a film is formed and a film to be formed can be suppressed. Note that hydrogen may be contained in the film to be formed as a hydrogen molecule, water, a hydroxyl group, or hydride in addition to a hydrogen atom.

In addition, at the formation of the oxide semiconductor layer, the distance between a target and the substrate (a T-S distance) is set to greater than or equal to 40 mm and less than or equal to 300 mm (preferably, greater than or equal to 60 mm).

Further, at the formation of the oxide semiconductor layer by a sputtering method, the temperature of the surface where a film is formed is higher than or equal to 150° C. and lower than or equal to 450°, preferably higher than or equal to 250° C. and lower than or equal to 320° C. The temperature at which entry of impurities such as water or hydrogen into the film to be formed is prevented and the impurity is released to a vapor phase in the chamber is 250° C. In addition, the upper limit of the temperature of the surface where a film is formed by a sputtering method is the upper limit of the heat treatment temperature for the substrate or the upper limit of the temperature of the film to be formed (if the temperature exceeds the latter upper limit, components in the film significantly change).

Moreover, when the leakage rate of the treatment chamber of the sputtering apparatus is set to less than or equal to $1 \times 10^{-10}$ Pa·m$^3$/second at the formation of the oxide semiconductor layer, entry of impurities such as an alkali metal or hydride into the oxide semiconductor layer that is being formed by a sputtering method can be reduced. Further, with the use of an entrapment vacuum pump (e.g., a cryopump) as an evacuation system, counter flow of an impurity such as an alkali metal, a hydrogen atom, a hydrogen molecule, water, a hydroxyl group, or hydride from the evacuation system can be reduced.

Further, at the formation of the oxide semiconductor layer, deposition may be performed by introducing a gas, such as a nitrogen gas, an oxygen gas, or an argon gas, into the treatment chamber of the sputtering apparatus in the state where the gas is being heated.

Further, preheat treatment may be performed before the formation of the oxide semiconductor layer, in order to remove water or hydrogen which remains on an inner wall of the sputtering apparatus, on a surface of the target, or inside the target material. As the preheat treatment, a method in which the inside of the film deposition chamber is heated to from 200° C. to 600° C. under reduced pressure, a method in which introduction and exhaust of nitrogen or an inert gas are repeated while the inside of the film deposition chamber is heated, and the like can be given. In this case, not water but oil or the like is preferably used as a coolant for the target. Although a certain level of effect can be obtained when introduction and exhaust of nitrogen are repeated without heating, it is more preferable to perform the treatment with the inside of the film formation chamber heated.

In this embodiment, at the formation of the oxide semiconductor layer 102, a high nitrogen concentration region 102a and a low nitrogen concentration region 102b are formed successively in the same chamber by changing the deposition condition plural times. By the successive formation in the same chamber, the respective interfaces of the stacked layers can be formed without being contaminated by atmospheric components or contamination impurities floating in the air.

For example, as the high nitrogen concentration region 102a, an In—Ga—Zn—O film containing nitrogen is deposited to a small thickness (less than or equal to 10 nm) by a sputtering method with the use of only a nitrogen gas. The nitrogen concentration in the In—Ga—Zn—O film containing nitrogen is approximately 11.7 atomic %. Note that the substrate is heated (the substrate temperature is higher than or equal to 150° C. and lower than or equal to 450° C.) at the deposition.

Next, after the amount of a nitrogen gas supplied is reduced, an oxygen gas or a rare gas is introduced and deposition is performed with the use of the same target while the substrate is continuously heated (the substrate temperature is higher than or equal to 150° C. and lower than or equal to 450° C.), so that the low nitrogen concentration region 102b is formed. The low nitrogen concentration region 102b has a larger thickness than the high nitrogen concentration region 102a. A region in the oxide semiconductor layer 102 which is on and in contact with the gate insulating layer 105 is the high nitrogen concentration region 102a. The low nitrogen concentration region 102b is provided over the high nitrogen concentration region 102a. The high nitrogen concentration region 102a and the low nitrogen concentration region 102b each have a hexagonal crystal structure. In this embodiment, the high nitrogen concentration region 102a and the low nitrogen concentration region 102b are each formed using an In—Ga—Zn—O film containing nitrogen and have a wurtzite crystal structure.

The gate insulating layer 105 and the oxide semiconductor layer 102 are preferably formed successively without exposure to the air. For example, a multi-chamber deposition apparatus is used. With the successive deposition, the respective interfaces of the stacked layers can be formed without being contaminated by atmospheric components or contamination impurity elements floating in the air. The nitrogen concentration of the oxide semiconductor layer 102 and the nitrogen concentration of the gate insulating layer 105 are particularly important; therefore, a multi-chamber deposition apparatus is preferably used in order that the oxide semiconductor layer 102 and the gate insulating layer 105 would not be exposed to remaining nitrogen inside the deposition chamber, a nitrogen atmosphere, or the like to prevent the change of their nitrogen concentrations. In addition, after the formation of the gate insulating layer 105, a surface thereof may be subjected to nitrogen plasma treatment with the use of a plasma CVD apparatus so that nitrogen is added to the vicinity of the surface. Alternatively, the surface of the gate insulating layer 105 may be subjected to nitrogen plasma treatment with the use of a sputtering apparatus before the formation of the oxide semiconductor layer 102 so that nitrogen is added to the vicinity of the surface.

Although depending on the deposition condition, in the case where the crystallinity is insufficient just after the deposition, heat treatment (at a temperature higher than or equal to 150° C. and lower than or equal to 650° C., preferably higher than or equal to 200° C. and lower than or equal to 500° C.) is performed in an atmosphere which hardly contains hydrogen and water (a nitrogen atmosphere, an oxygen atmosphere, a dry-air atmosphere (e.g., as for moisture, the dew point is lower than or equal to −40° C., preferably lower than or equal to −60° C.), or the like).

Next, the oxide semiconductor layer 102 is patterned, and then a source electrode layer 103 and a drain electrode layer 104 are formed. As a material of a metal conductive film which is to be the source electrode layer 103 and the drain electrode layer 104, a metal material such as Al, Cu, Cr, Ta, Ti, Mo, or W, or an alloy material containing the metal material as a component is used. In addition, a structure in which a layer of a refractory metal such as Cr, Ta, Ti, Mo, or W is stacked on a lower side and/or an upper side of a metal layer of Al, Cu, or the like may be used.

For example, the metal conductive film preferably has a three-layer structure in which an aluminum layer is stacked over a titanium layer and a titanium layer is stacked over the aluminum layer, or a three-layer structure in which an aluminum layer is stacked over a molybdenum layer and a molybdenum layer is stacked over the aluminum layer. Alternatively, the metal conductive film can have a two-layer structure in which an aluminum layer and a tungsten layer are stacked or a two-layer structure in which an aluminum layer and a molybdenum layer are stacked. Needless to say, the metal conductive film may have a single-layer structure or a stacked-layer structure including four or more layers. Note that in the case where copper is used as one of the materials of the metal conductive film, a stack in which a copper layer is provided in contact with a copper-magnesium-aluminum alloy layer which is provided in contact with the oxide semiconductor layer may be used.

Next, a protective insulating layer 107 is formed so as to cover an exposed portion of the oxide semiconductor layer 102 so that the oxide semiconductor layer 102 is protected. As the protective insulating layer 107, a stacked-layer structure including one or more of silicon oxide, silicon oxynitride, silicon nitride, silicon nitride oxide, aluminum oxide, aluminum oxynitride, aluminum gallium oxide, and gallium oxide can be used.

Note that the thickness of the protective insulating layer 107 is greater than or equal to 50 nm, preferably greater than or equal to 200 nm and less than or equal to 500 nm. With the protective insulating layer being thick, the amount of oxygen released from the protective insulating layer 107 can be increased, and thus defects at the interface between the protective insulating layer 107 and the oxide semiconductor layer 102 can be reduced. The protective insulating layer 107 from which part of contained oxygen is released by heat treatment is easily formed by a sputtering method, which is preferable. When the protective insulating layer 107 from which part of contained oxygen is released by heat treatment is formed by a sputtering method, the amount of oxygen contained in a deposition gas is preferably large, and oxygen, a mixed gas of oxygen and a rare gas, or the like can be used. Typically, the oxygen concentration of a deposition gas is preferably higher than or equal to 6% and less than or equal to 100%.

After the protective insulating layer 107 is formed, if necessary, heat treatment (at a temperature higher than or equal to 150° C. and lower than or equal to 650° C., preferably higher than or equal to 200° C. and lower than or equal to 500° C.) may be performed in an atmosphere which hardly contains hydrogen and water (a nitrogen atmosphere, an oxygen atmosphere, a dry-air atmosphere (e.g., as for moisture, the dew point is lower than or equal to −40° C., preferably lower than or equal to −60° C.), or the like).

Through the above process, a transistor 111 illustrated in FIG. 1A is formed. The transistor 111 is a transistor in which a channel region includes a crystalline oxide semiconductor film including a crystal which has a hexagonal crystal structure (here, a wurtzite crystal structure) having a c-axis almost perpendicular to a surface of the crystalline oxide semiconductor film.

Note that at the formation of the oxide semiconductor layer 102, the nitrogen concentration profile varies depending on a deposition condition to be changed.

Figure 2A:
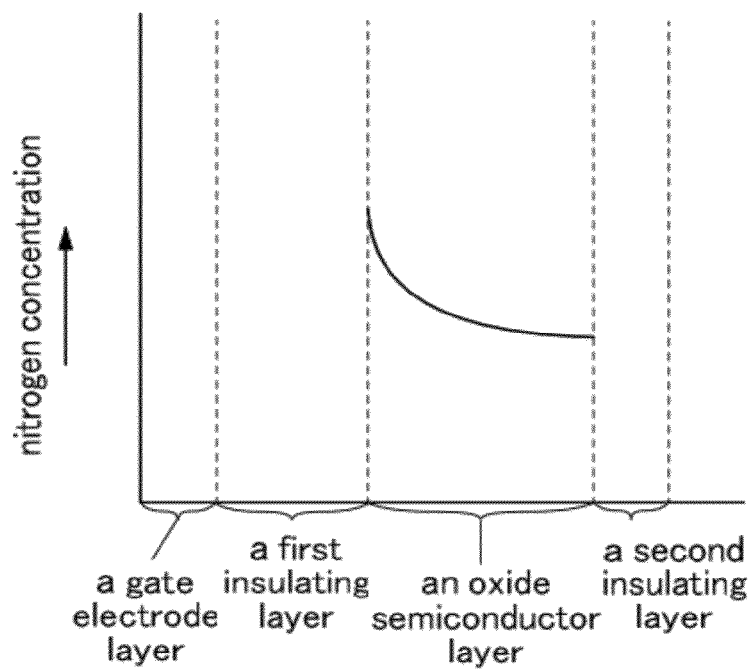
FIGS. 2A and 2B are examples of a model diagram showing a concentration profile of one embodiment of the present invention.

For example, the deposition condition of the oxide semiconductor layer 102 is changed by continuously changing a gas flow gate, so that a nitrogen concentration profile shown in FIG. 2A can be obtained. FIG. 2A is a schematic diagram showing a nitrogen concentration profile in the thickness direction in the case of a cross section taken along a chain line in FIG. 1A. FIG. 2A shows a concentration gradient in which a region on the gate insulating layer side has the highest nitrogen concentration, and the nitrogen concentration is reduced continuously as the distance from the gate insulating layer becomes longer.

Figure 2B:
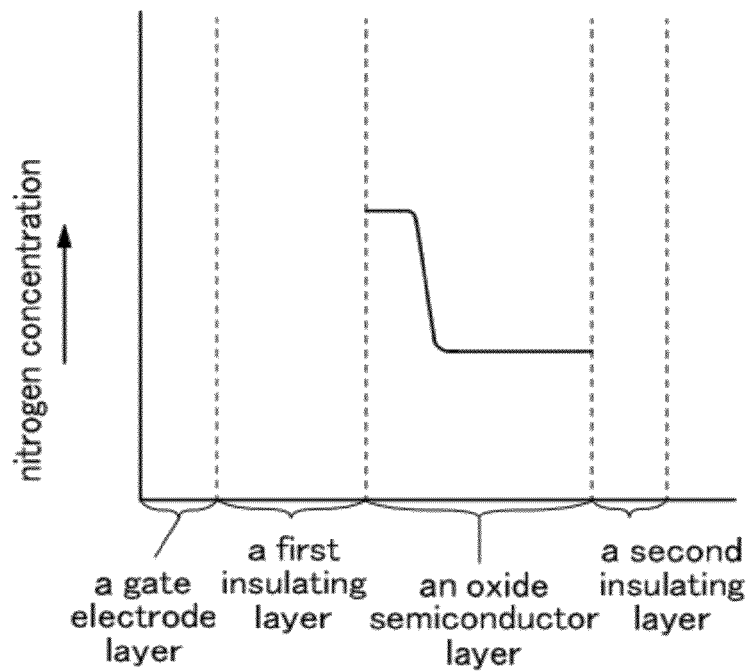

Further, with the same target is used, the deposition condition of the oxide semiconductor layer 102 is changed by varying the gas flow rate stepwise, so that a nitrogen concentration profile illustrated in FIG. 2B can be obtained. A first insulating layer and a second insulating layer in FIG. 2B are the gate insulating layer and the protective insulating layer, respectively. In the case where the gas flow rate is varied stepwise, the nitrogen concentration profile tends to have a step-like shape. FIG. 2B shows a concentration gradient in which a region on the gate insulating side has the highest nitrogen concentration, and the nitrogen concentration is reduced stepwise as the distance from the gate insulating layer becomes longer. In the case where the deposition condition of the oxide semiconductor layer 102 is changed by varying the gas flow rate stepwise, films having different film qualities are formed under the respective deposition conditions; therefore, the oxide semiconductor layer 102 can be regarded as a stack of layers. Note that the high nitrogen concentration region 102a has high crystallinity and the low nitrogen concentration region 102b has lower crystallinity than the high nitrogen concentration region 102a. However, the high nitrogen concentration region 102a and the low nitrogen concentration region 102b have the same wurtzite crystal structures and thus, it is difficult to recognize the boundary between the high nitrogen concentration region 102a and the low nitrogen concentration region 102b with a TEM photograph or the like.

Figure 3A:
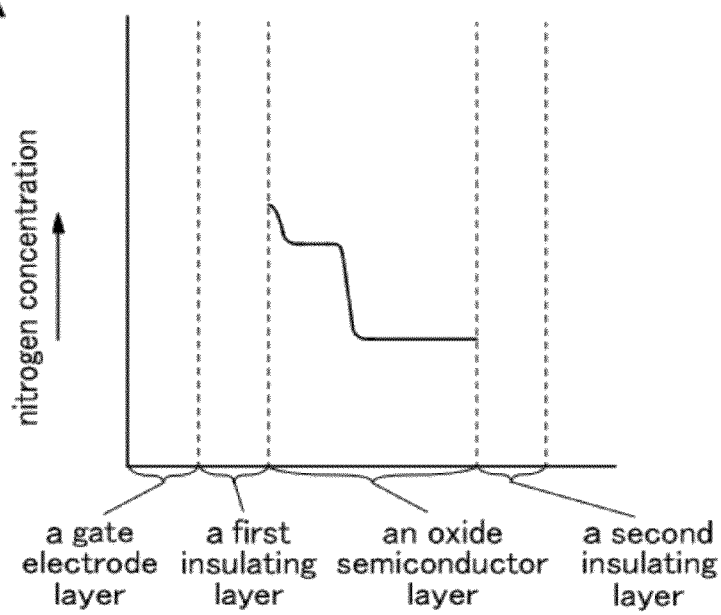
FIGS. 3A and 3B are examples of a model diagram showing a concentration profile of one embodiment of the present invention.

Nitrogen may be added to the vicinity of the surface by performing nitrogen plasma treatment on the surface of the gate insulating layer. In that case, a nitrogen concentration profile shown in FIG. 3A can be obtained. Further, in the case where nitrogen plasma treatment is performed, heat treatment is preferably performed under a reduced pressure before performing the nitrogen plasma treatment. Note that the nitrogen plasma treatment may be performed in a sputtering deposition chamber. Alternatively, the nitrogen plasma treatment may be performed after formation of the gate insulating layer in a plasma CVD apparatus in which the gate insulating layer has been formed.

Figure 3B:
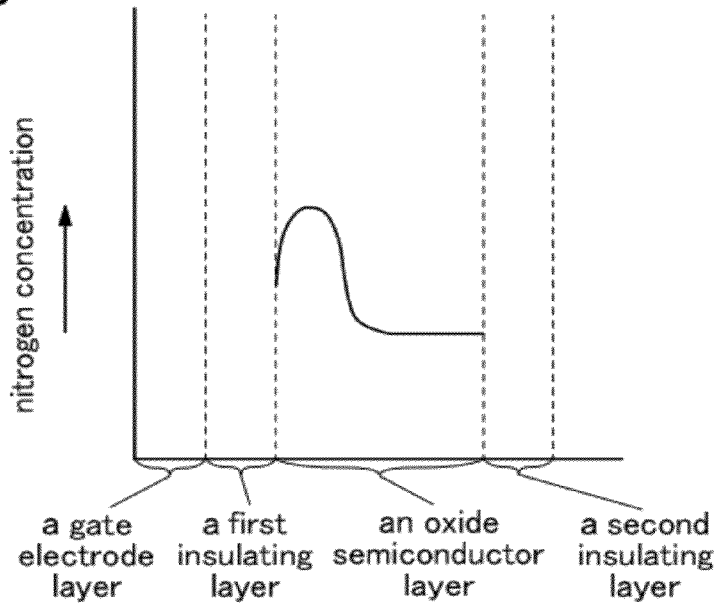

Further, a region having the highest nitrogen concentration is not limited to an interface with the gate insulating layer, and a nitrogen concentration profile shown in FIG. 3B can be obtained. As shown in FIG. 3B, the deposition condition may be adjusted so that a region which is slightly apart from the interface with the gate insulating layer has the highest nitrogen concentration.

Specifically, the nitrogen concentration of the high nitrogen concentration region 102a is higher than or equal to $5 \times 10^{19}/cm^3$ and lower than or equal to 20 atomic %, preferably higher than or equal to $1 \times 10^{20}/cm^3$ and lower than 7 atomic %.

Further, the nitrogen concentration of the low nitrogen concentration region 102b is lower than $5 \times 10^{19}/cm^3$, preferably higher than or equal to $1 \times 10^{17}/cm^3$ and lower than $5 \times 10^{19}/cm^3$.

In the transistor 111 including the oxide semiconductor layer which has the nitrogen concentration profile shown in FIG. 2A, FIG. 2B, FIG. 3A, or FIG. 3B by varying the gas flow rate of nitrogen stepwise or continuously, the high nitrogen concentration region 102a is provided in the vicinity of the interface with the gate insulating layer. The high nitrogen concentration region 102a has high crystallinity as compared to another region and has c-axis alignment, and the interface state which is derived from a dangling bond is reduced at the interface with the gate insulating layer, so that a favorable interface state can be achieved.

Further, a crystal included in the high nitrogen concentration region 102a has a wurtzite crystal structure that is a hexagonal crystal structure, and a crystal included in the low nitrogen concentration region 102b also has the same structure. Ideally, the whole of the low nitrogen concentration region 102b has a wurtzite crystal structure that is a hexagonal crystal structure.

Figure 1B:
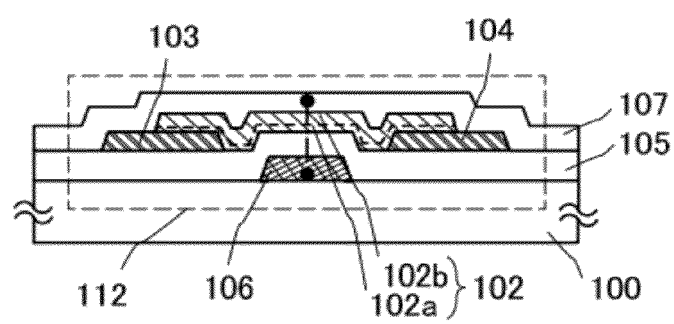
Figure 1C:
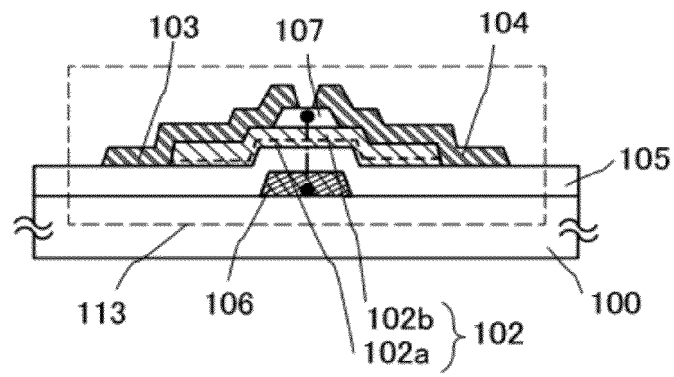

Further, this embodiment is not limited to the structure of the bottom-gate transistor illustrated in FIG. 1A, and a transistor 112 illustrated in FIG. 1B or a transistor 113 illustrated in FIG. 1C can be applied.

The structure of the transistor 112 illustrated in FIG. 1B is called an inverted coplanar type (a bottom-contact type). The transistor 112 is an example in which the order of formation of the source electrode layer 103 and the drain electrode layer 104 and formation of the oxide semiconductor layer 102 is different from that of the transistor 111, and the oxide semiconductor layer 102 is provided over the source electrode layer 103 and the drain electrode layer 104.

The structure of the transistor 113 illustrated in FIG. 1C is called a channel stop type. The transistor 113 is an example in which the order of formation of the source electrode layer 103 and the drain electrode layer 104 and formation of the protective insulating layer 107 is different from that of from the transistor 111. The protective insulating layer 107 of the transistor 113 is formed in a position overlapping with the gate electrode layer 106 with the oxide semiconductor layer and the gate insulating layer 105 provided therebetween, and functions as a channel stopper.

(Embodiment 2)

Figure 1D:
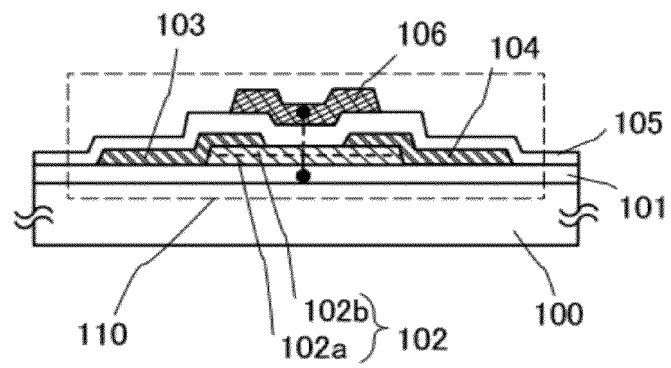

An example of a top-gate transistor illustrated in FIG. 1D is described in this embodiment while an example of the bottom-gate transistor is described in Embodiment 1. Note that in FIG. 1D, components common to those of FIG. 1A maintain the same reference numerals.

First, a base insulating layer 101 is formed over a substrate 100.

The base insulating layer 101 can be formed with a single layer or a stacked layer using one or more of silicon oxide, silicon oxynitride, silicon nitride oxide, aluminum oxide, aluminum oxynitride, gallium oxide, hafnium oxide, yttrium oxide, and the like by a CVD method, a sputtering method, or the like.

Next, an oxide semiconductor layer 102 is formed over the base insulating layer 101. The oxide semiconductor layer 102 is deposited with the use of one of an AC sputtering apparatus, a DC sputtering apparatus, and an RF sputtering apparatus. Further, at the formation of the oxide semiconductor layer by a sputtering method, the temperature of a surface where a film is formed is higher than or equal to 150° C. and lower than or equal to 450°, preferably higher than or equal to 250° C. and lower than or equal to 320° C. The temperature at which entry of impurities such as water or hydrogen into the film to be formed is prevented and the impurity is released to a vapor phase in the chamber is 250° C. In addition, the upper limit of the temperature of the surface where a film is formed by a sputtering method is the upper limit of the heat treatment temperature for the substrate or the upper limit of the temperature of the film to be formed (if the temperature exceeds the latter upper limit, components in the film significantly change).

The base insulating layer 101 and the oxide semiconductor layer are preferably formed successively without exposure to the air. For example, a multi-chamber deposition apparatus is used. With the successive deposition, the respective interfaces of the stacked layers can be formed without being contaminated by atmospheric components or contamination impurity elements floating in the air.

After the oxide semiconductor layer is formed, if necessary, heat treatment (at a temperature higher than or equal to 150° C. and lower than or equal to 650° C., preferably higher than or equal to 200° C. and lower than or equal to 500° C.) may be performed in an atmosphere which hardly contains hydrogen and water (a nitrogen atmosphere, an oxygen atmosphere, a dry-air atmosphere (e.g., as for moisture, the dew point is lower than or equal to −40° C., preferably lower than or equal to −60° C.), or the like). This heat treatment can also be referred to as dehydration or dehydrogenation in which H, OH, or the like is released from the oxide semiconductor layer.

In this embodiment, at the formation of the oxide semiconductor layer 102, a high nitrogen concentration region 102a and a low nitrogen concentration region 102b are formed successively in the same chamber by changing the deposition condition plural times.

For example, as the high nitrogen concentration region 102a, an In—Ga—Zn—O film containing nitrogen is deposited to a thickness less than or equal to 10 nm by a sputtering method with the use of only a nitrogen gas. Note that the substrate is heated (the substrate temperature is higher than or equal to 150° C. and lower than or equal to 450° C.) at the deposition.

Next, after the amount of a nitrogen gas supplied is reduced, an oxygen gas or a rare gas is introduced and deposition is performed with the use of the same target while the substrate is continuously heated (the substrate temperature is higher than or equal to 150° C. and lower than or equal to 450° C.), so that the low nitrogen concentration region 102b is formed. The thickness of the low nitrogen concentration region 102b is the same as or lower than that of the high nitrogen concentration region 102a. In addition, when sufficient crystallinity can be obtained, the thickness of the low nitrogen concentration region 102b is larger than that of the high nitrogen concentration region 102a.

The low nitrogen concentration region 102b is provided over the high nitrogen concentration region 102a. The high nitrogen concentration region 102a and the low nitrogen concentration region 102b each have a hexagonal crystal structure. In this embodiment, the high nitrogen concentration region 102a and the low nitrogen concentration region 102b are each formed using an In—Ga—Zn—O film containing nitrogen and have a wurtzite crystal structure.

Next, the oxide semiconductor layer 102 is patterned, and a source electrode layer 103 and a drain electrode layer 104 are formed. Then, a gate insulating layer 105 covering the oxide semiconductor layer 102, the source electrode layer 103, and the drain electrode layer 104 is formed. A gate electrode layer 106 is formed in a position overlapping with the oxide semiconductor layer 102 over the gate insulating layer, so that a transistor 110 can be manufactured.

A material of the gate electrode layer 106 is formed using a metal material such as titanium, molybdenum, chromium, tantalum, tungsten, aluminum, or copper, or an alloy material thereof.

As a material layer which is provided between the gate electrode layer 106 and a gate insulating layer and in contact with the gate insulating layer, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride film (InN, ZnN, or the like) is preferably used. These films each have a work function of 5 eV or higher, preferably 5.5 eV or higher; thus, the threshold voltage of the electrical characteristics of the transistor can be made to be positive, so that a so-called normally-off switching element can be realized. For example, in the case where an In—Ga—Zn—O film containing nitrogen is used, an In—Ga—Zn—O film whose nitrogen concentration is higher than at least the nitrogen concentration of an oxide semiconductor layer 102, for example, an In—Ga—Zn—O film having a nitrogen concentration of 7 atomic % or more is used.

Through the above process, the transistor 110 illustrated in FIG. 1D is formed. The transistor 110 is a transistor in which a channel region includes a crystalline oxide semiconductor film including a crystal which has a hexagonal crystal structure (here, a wurtzite crystal structure) having a c-axis almost perpendicular to a surface of the crystalline oxide semiconductor film.

(Embodiment 3)

In this embodiment, a semiconductor film including a stacked-layer structure of oxide semiconductor films having different nitrogen concentrations is described with reference to FIG. 4, FIGS. 5A and 5B, FIG. 6, and FIGS. 7A and 7B. The stacked-layer structure includes a first oxide semiconductor film which includes a crystal having a wurtzite crystal structure and a second oxide semiconductor film which also includes a crystal having a wurtzite crystal structure.

Figure 4:
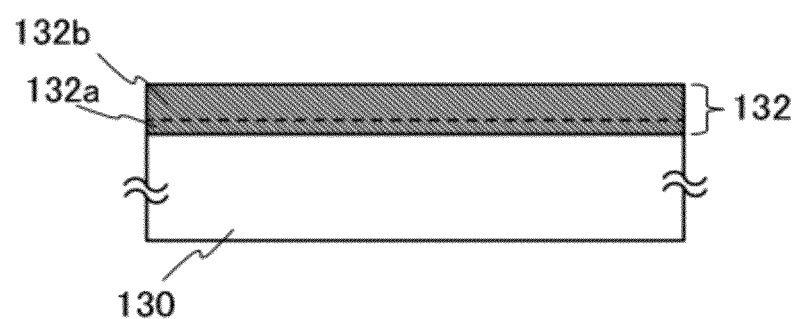
FIG. 4 is a cross-sectional view illustrating a semiconductor film according to one embodiment of the present invention.

A schematic view of the semiconductor film having a stacked-layer structure, which is described as an example in this embodiment, is illustrated in FIG. 4.

A semiconductor film 132 having a structure including a stack of layers which are formed using the same material and have different nitrogen concentrations includes a first oxide semiconductor film 132a and a second oxide semiconductor film 132b. An embodiment of the semiconductor film 132 having a structure in which the stack of the first oxide semiconductor film 132a and the second oxide semiconductor film 132b is provided in contact with an insulating surface of a substrate 130 is illustrated in FIG. 4. The first oxide semiconductor film 132a has higher crystallinity than the second oxide semiconductor film 132b.

The semiconductor film 132 having a structure including the stack of layers which are formed using the same material and have different nitrogen concentrations can be formed by a manufacturing method of Embodiment 1 or 2. Note that although examples in which a stack of layers having different nitrogen concentrations is formed by changing the deposition condition in the same chamber are described in Embodiment 1 and Embodiment 2, an embodiment is not limited thereto as long as a film having a wurtzite crystal structure can be stacked, and after the first layer is formed, heat treatment at a temperature higher than or equal to 150° C. and lower than or equal to 650° C. may be performed in an atmosphere hardly containing hydrogen and moisture (a nitrogen atmosphere, an oxygen atmosphere, a dry-air atmosphere (e.g., as for moisture, the dew point is lower than or equal to −40° C., preferably lower than or equal to −60° C.), or the like), and then the second layer may be formed.

<Hexagonal Crystal Structure>

First, a hexagonal crystal structure is described.

Figure 5A:
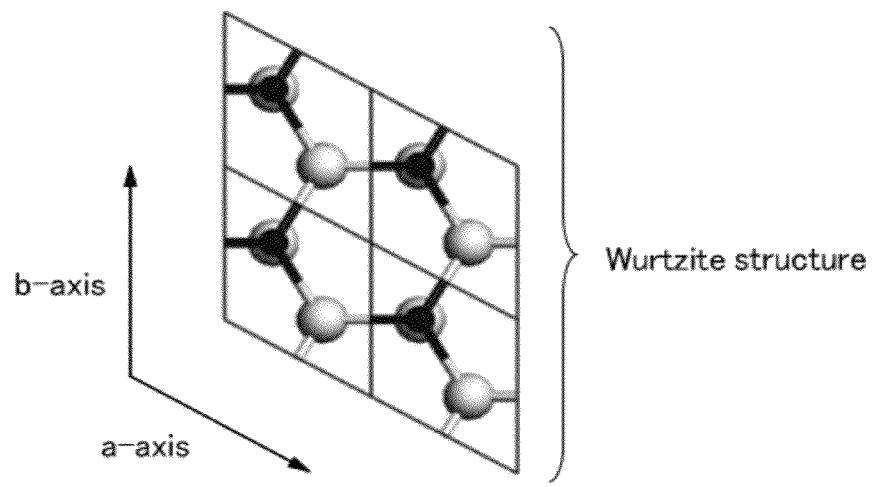
FIGS. 5A and 5B are schematic views illustrating a wurtzite crystal structure according to one embodiment of the present invention.
Figure 5B:
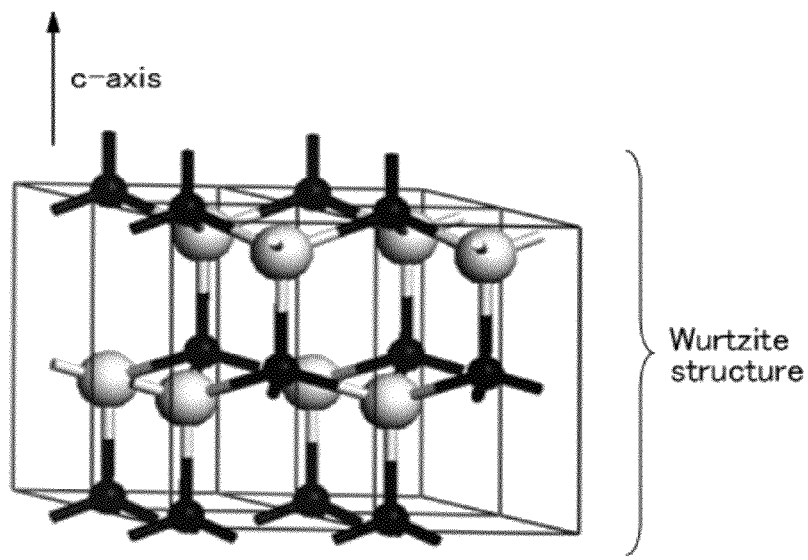

A wurtzite crystal structure is described with reference to FIGS. 5A and 5B. The locations of atoms at an a-b plane of a crystal having a wurtzite structure is illustrated in FIG. 5A, and the locations of atoms in which a longitudinal is a c-axis direction is illustrated in FIG. 5B.

As the first oxide semiconductor film 132a, a film of an oxide semiconductor containing nitrogen is used, and the film is formed so as to have c-axis alignment and include a crystal having a wurtzite structure by adjusting the deposition condition.

Specifically, an In—Ga—Zn—O film containing nitrogen at a concentration higher than or equal to $5 \times 10^{19}/cm^3$ and lower than or equal to 20 atomic % is c-axis aligned and includes a crystal having a wurtzite structure, and In, Ga, and Zn are randomly arranged in a metal site.

Note that the first oxide semiconductor film 132a is not limited to the In—Ga—Zn—O film containing nitrogen, and an In—Al—Zn—O film containing nitrogen may be used, for example.

Next, a wurtzite crystal structure of the second layer is described.

As the second oxide semiconductor film 132b, an In—Ga—Zn—O film whose nitrogen concentration is lower than the first oxide semiconductor film 132a, has c-axis alignment, and include a crystal having a wurtzite structure.

The wurtzite crystal structure is a hexagonal structure in which atoms are arranged in a hexagonal shape at an a-b plane.

Figure 6:
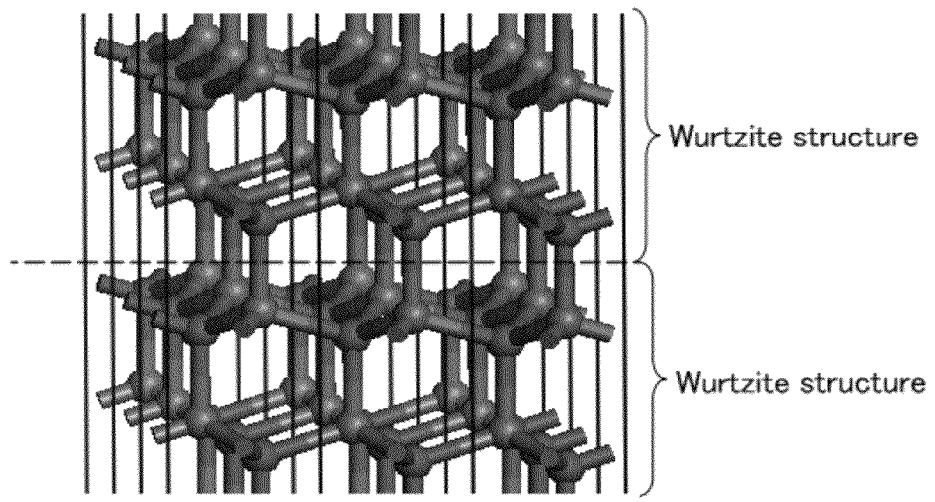
FIG. 6 is a schematic view illustrating a stack of layers each having a wurtzite crystal structure according to one embodiment of the present invention.

FIG. 6 schematically illustrates a state where a crystal having a wurtzite structure is provided over and aligned with another crystal having a wurtzite structure and having the same lattice constant.

Note that in a real observation image of a wurtzite crystal structure having c-axis alignment which is obtained by a high-angle annular dark field (HAADF)-STEM, a diffraction image in which bright spots appear alternately is observed in some cases.

Figure 7A:
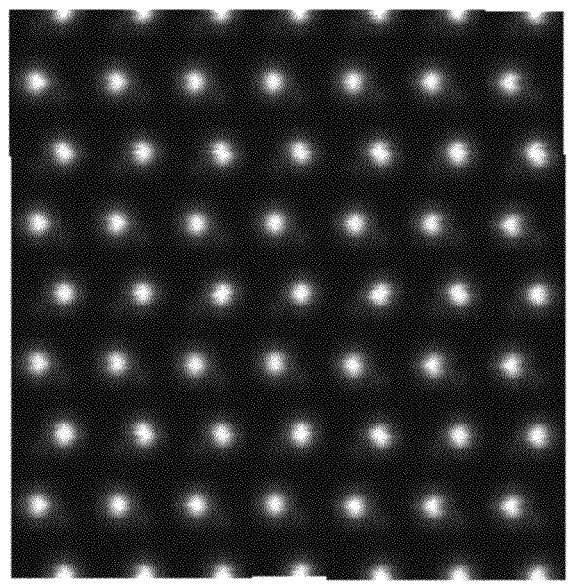
FIGS. 7A and 7B are a HAADF-STEM image obtained by calculation and a HAADF observation image, respectively, each showing a crystal structure according to one embodiment of the present invention.

A HAADF-STEM image obtained by calculation on the basis of a wurtzite crystal structure is shown in FIG. 7A.

Figure 7B:
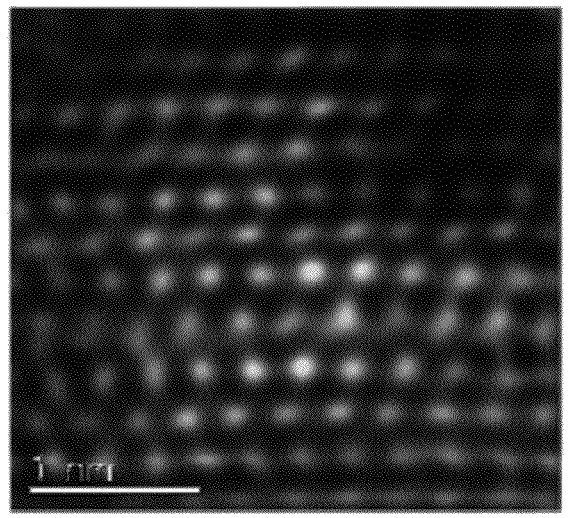

A real observation image of an In—Ga—Zn—O film containing much nitrogen by HAADF-STEM is shown in FIG. 7B.

In each of the image of HAADF-STEM shown in FIG. 7A and the real observation image by HAADF-STEM shown in FIG. 7B, a wurtzite crystal structure having two-cycle periodicity can be confirmed.

The In—Ga—Zn—O film containing nitrogen was deposited to a thickness of 300 nm over a quartz glass substrate by a sputtering method. The deposition was performed under the following conditions: a target having a composition ratio of $In_2O_3:Ga_2O_3:ZnO=1:1:1$ [molar ratio] was used; the distance between the substrate and the target was 60 mm; a DC power source was used; the power was 0.5 kw; and the pressure was 0.4 Pa. Further, the substrate temperature during the deposition was 400° C., and only nitrogen was used as a sputtering gas and flows into a deposition chamber at a flow rate of 40 sccm.

(Embodiment 4)

In this embodiment, an example will be described below, in which a display device including at least part of a driver circuit and a transistor disposed in a pixel portion are provided over one substrate is manufactured.

A transistor disposed in the pixel portion is formed in accordance with Embodiment 1 or Embodiment 2. Further, the transistor described in Embodiment 1 or Embodiment 2 is an n-channel transistor, and thus part of a driver circuit that can be formed using n-channel transistors among driver circuits is formed over the same substrate as the transistor in the pixel portion.

Figure 8A:
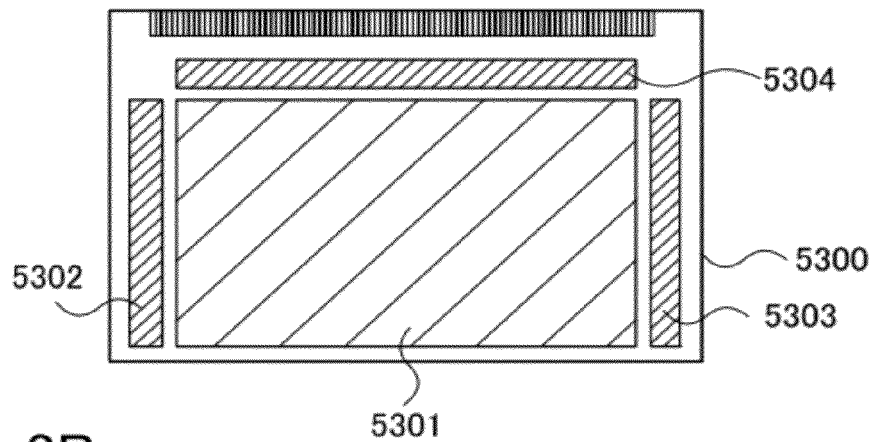
FIGS. 8A to 8C are a block diagram and equivalent circuit diagrams, illustrating one embodiment of the present invention.

FIG. 8A is one example of a block diagram of an active matrix display device. Over a substrate 5300 in the display device, a pixel portion 5301, a first scan line driver circuit 5302, a second scan line driver circuit 5303, and a signal line driver circuit 5304 are provided. In the pixel portion 5301, a plurality of signal lines extended from the signal line driver circuit 5304 is arranged and a plurality of scan lines extended from the first scan line driver circuit 5302 and the second scan line driver circuit 5303 is arranged. Note that pixels which include display elements are provided in a matrix in respective regions where the scan lines and the signal lines intersect with each other. Further, the substrate 5300 in the display device is connected to a timing control circuit (also referred to as a controller or a controller IC) through a connection portion such as a flexible printed circuit (FPC)

In FIG. 8A, the first scan line driver circuit 5302, the second scan line driver circuit 5303, and the signal line driver circuit 5304 are formed over the same substrate 5300 as the pixel portion 5301. Accordingly, the number of components of a driver circuit which is provided outside and the like are reduced, so that reduction in cost can be achieved. Further, if the driver circuit is provided outside the substrate 5300, wirings would need to be extended and the number of connections of wirings would be increased. However, if the driver circuit is provided over the substrate 5300, the number of wiring connections can be reduced. Consequently, improvement in reliability and yield can be achieved.

Figure 8B:
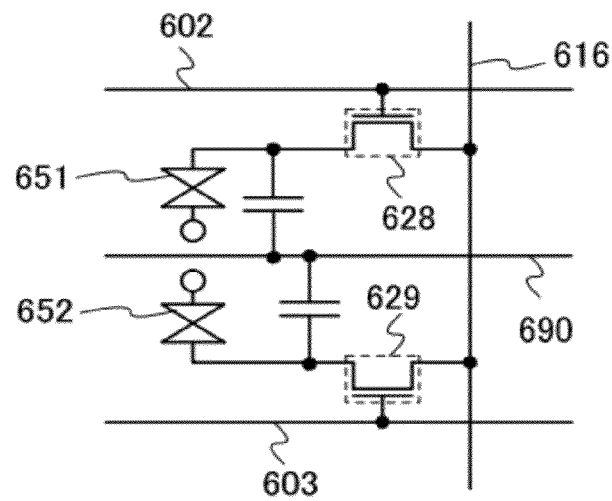

FIG. 8B illustrates one example of a circuit configuration of the pixel portion. Here, a pixel structure of a VA liquid crystal display panel is illustrated.

In this pixel structure, a plurality of pixel electrode layers is included in one pixel, and a transistor is connected to each of the pixel electrode layers. The transistors are driven by different gate signals. That is, signals that are applied to individual pixel electrode layers in a multi-domain pixel are controlled independently.

A gate wiring 602 of a transistor 628 and a gate wiring 603 of a transistor 629 are separated so that different gate signals can be supplied thereto. In contrast, a source or drain electrode layer 616 functioning as a data line is used in common for the transistor 628 and the transistor 629. As each of the transistors 628 and 629, the transistor described in Embodiment 1 or Embodiment 2 can be used as appropriate A first pixel electrode layer and a second pixel electrode layer have different shapes and are separated by a slit. The second pixel electrode layer is provided so as to surround the external side of the first pixel electrode layer which is spread in a V shape. Timings of voltage application are varied between the first pixel electrode layer and the second pixel electrode layer by the transistor 628 and the transistor 629 in order to control alignment of liquid crystal. The transistor 628 is connected to the gate wiring 602, and the transistor 629 is connected to the gate wiring 603. When different gate signals are supplied to the gate wiring 602 and the gate wiring 603, operation timings of the transistor 628 and the transistor 629 can be varied.

Further, a storage capacitor is formed using a capacitor wiring 690, a gate insulating layer as a dielectric, and a capacitor electrode electrically connected to the first pixel electrode layer or the second pixel electrode layer.

The first pixel electrode layer, a liquid crystal layer, and a counter electrode layer overlap with each other to form a first liquid crystal element 651. The second pixel electrode layer, the liquid crystal layer, and the counter electrode layer overlap with each other to form a second liquid crystal element 652. The pixel structure is a multi-domain structure in which the first liquid crystal element 651 and the second liquid crystal element 652 are provided in one pixel.

Note that the pixel structure is not limited to that illustrated in FIG. 8B. For example, a switch, a resistor, a capacitor, a transistor, a sensor, or a logic circuit may be added to the pixel illustrated in FIG. 8B. In addition, a light-blocking layer is provided so that the oxide semiconductor layer of the transistor is not irradiated with light from a backlight or external light. The light-blocking layer may be provided between the pixel electrode layer and the oxide semiconductor layer, or an optical film (a color filter or the like) including the light-blocking layer may be attached to the substrate.

In this embodiment, an example of a VA liquid crystal display panel is illustrated; however, one embodiment of the present invention is not particularly limited thereto and can be applied to various modes of liquid crystal display devices. For example, as a method for improving viewing angle characteristics, one embodiment of the present invention can be applied to a lateral electric field mode (also referred to as an IPS mode) in which an electric field in the horizontal direction to the main surface of a substrate is applied to a liquid crystal layer.

For example, it is preferable to use liquid crystal exhibiting a blue phase for which an alignment film is not necessary for an IPS liquid crystal display panel. A blue phase is one of liquid crystal phases, which appears just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer of the liquid crystal element in order to improve the temperature range. The liquid crystal composition which includes liquid crystal exhibiting a blue phase and a chiral agent has a short response time of 1 millisecond or less, and has optical isotropy, which makes the alignment process unneeded and viewing angle dependence small.

Further, in order to improve moving-image characteristics of a liquid crystal display device, a driving technique (e.g., a field sequential method) may be employed, in which a plurality of light-emitting diodes (LEDs) or a plurality of EL light sources is used as a backlight to form a planar light source, and each light source of the planar light source is independently driven in a pulsed manner in one frame period. As the planar light source, three or more kinds of LEDs may be used or an LED emitting white light may be used. In the case where three or more kinds of light sources emitting different colors (e.g., light sources of red (R), green (G), and blue (B)) are used as the planar light source, color display can be performed without a color filter. Further, in the case where an LED emitting white light is used as the planar light source, color display is performed with a color filter. Since a plurality of LEDs can be controlled independently, the light emission timing of LEDs can be synchronized with the timing at which the liquid crystal layer is optically modulated. The LEDs can be partly turned off, and thus power consumption can be reduced particularly in the case of displaying an image in which a black display region occupies a large area in one screen.

Figure 8C:
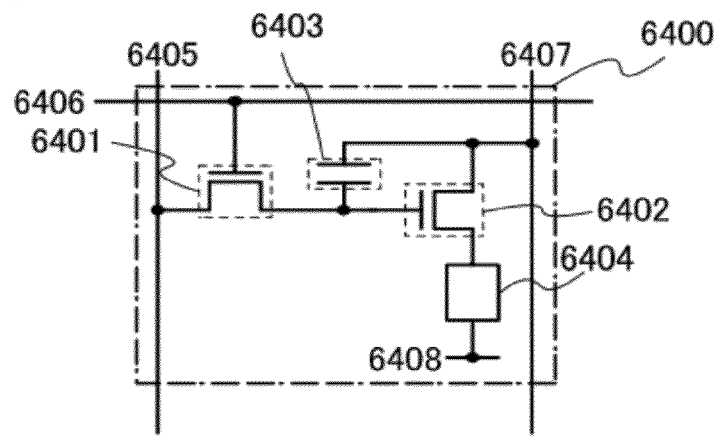

FIG. 8C illustrates one example of a circuit configuration of the pixel portion. Here, a pixel structure of a display panel using an organic EL element is illustrated.

In an organic EL element, by application of voltage to a light-emitting element, electrons and holes are separately injected from a pair of electrodes into a layer containing a light-emitting organic compound, and thus current flows. The carriers (electrons and holes) are recombined, and thus the light-emitting organic compound is in excited state. Light is emitted when the light-emitting organic compound in the excited state returns to a ground state. Owing to such a mechanism, this light-emitting element is referred to as a current-excitation light-emitting element.

FIG. 8C illustrates one example of a pixel structure to which digital time grayscale driving can be applied, as an example of a semiconductor device.

A structure and operation of a pixel to which digital time grayscale driving can be applied will be described. An example is described in this embodiment, in which one pixel includes two n-channel transistors using an oxide semiconductor layer in a channel formation region.

A pixel 6400 includes a switching transistor 6401, a driving transistor 6402, a light-emitting element 6404, and a capacitor 6403. A gate electrode layer of the switching transistor 6401 is connected to a scan line 6406. A first electrode (one of a source electrode layer and a drain electrode layer) of the switching transistor 6401 is connected to a signal line 6405. A second electrode (the other of the source electrode layer and the drain electrode layer) of the switching transistor 6401 is connected to a gate electrode layer of the driving transistor 6402. The gate electrode layer of the driving transistor 6402 is connected to a power supply line 6407 through the capacitor 6403. A first electrode of the driving transistor 6402 is connected to the power supply line 6407. A second electrode of the driving transistor 6402 is connected to a first electrode (a pixel electrode) of the light-emitting element 6404. A second electrode of the light-emitting element 6404 corresponds to a common electrode 6408. The common electrode 6408 is electrically connected to a common potential line provided over the same substrate.

The second electrode (the common electrode 6408) of the light-emitting element 6404 is set to a low power supply potential. Note that the low power supply potential is a potential satisfying the relation, the low power supply potential<a high power supply potential, the high power supply potential is supplied to the power supply line 6407. As the low power supply potential, GND or 0 V may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is higher than or equal to forward threshold voltage of the light-emitting element 6404.

Note that gate capacitance of the driving transistor 6402 may be used as a substitute for the capacitor 6403, so that the capacitor 6403 can be omitted. The gate capacitance of the driving transistor 6402 may be formed between the channel formation region and the gate electrode layer.

In the case of a voltage-input voltage driving method, a video signal is input to the gate electrode layer of the driving transistor 6402 so that the driving transistor 6402 is either sufficiently turned on or sufficiently turned off. That is, the driving transistor 6402 operates in a linear region, and thus voltage higher than the voltage of the power supply line 6407 is applied to the gate electrode layer of the driving transistor 6402. Note that voltage higher than or equal to (voltage of the power supply line+Vth of the driving transistor 6402) is applied to the signal line 6405.

In the case of performing analog grayscale driving instead of digital time grayscale driving, the same pixel structure as FIG. 8C can be used by changing signal input.

In the case of performing analog grayscale driving, voltage higher than or equal to the sum of the forward voltage of the light-emitting element 6404 and Vth of the driving transistor 6402 is applied to the gate electrode layer of the driving transistor 6402. The forward voltage of the light-emitting element 6404 indicates voltage at which a desired luminance is obtained, and includes at least forward threshold voltage. By inputting a video signal which enables the driving transistor 6402 to operate in a saturation region, current can be supplied to the light-emitting element 6404. In order for the driving transistor 6402 to operate in the saturation region, the potential of the power supply line 6407 is set to be higher than the gate potential of the driving transistor 6402. When an analog video signal is used, it is possible to feed current to the light-emitting element 6404 in accordance with the video signal and perform analog grayscale driving.

Note that the pixel structure is not limited to that illustrated in FIG. 8C. For example, a switch, a resistor, a capacitor, a sensor, a transistor, or a logic circuit may be added to the pixel illustrated in FIG. 8C.

Figure 9A:
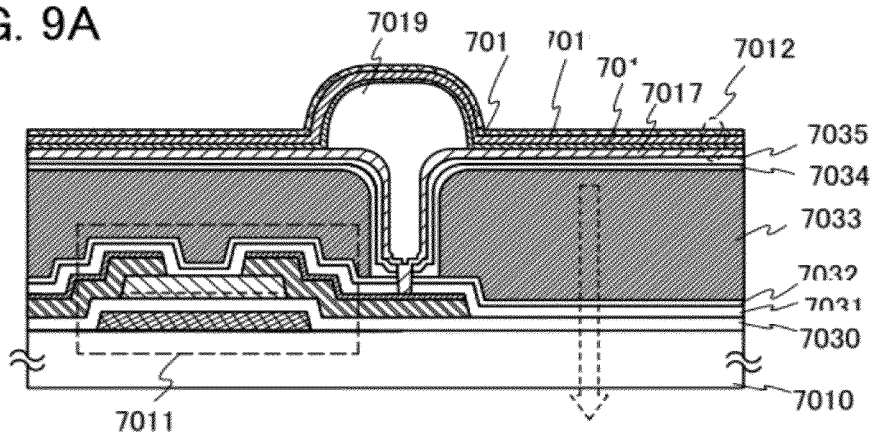
FIGS. 9A to 9C are cross-sectional views each illustrating one embodiment of the present invention.
Figure 9B:
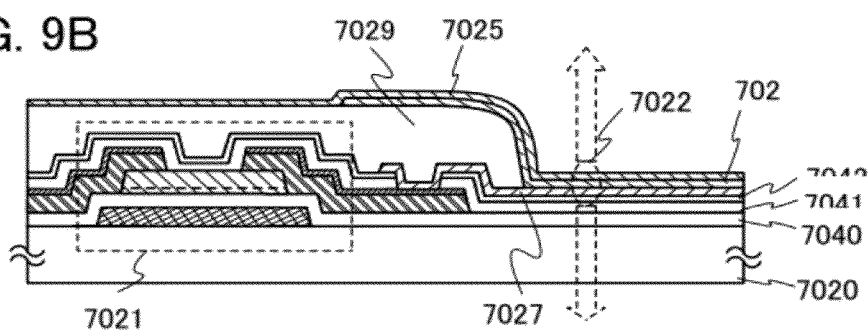
Figure 9C:
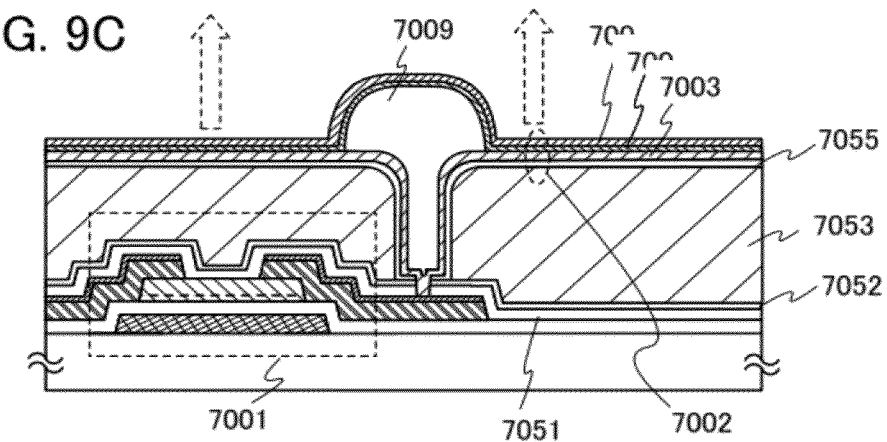

Next, structures of a light-emitting element will be described with reference to cross-sectional structures of a pixel, which are illustrated in FIGS. 9A to 9C. Here, cross-sectional structures of a pixel will be described by taking an n-channel light-emitting element driving transistor as an example. Light-emitting element driving transistors 7011, 7021, and 7001 which are used for semiconductor devices illustrated in FIGS. 9A to 9C can be manufactured in a manner similar to that of the transistor described in Embodiment 1 or Embodiment 2, and are transistors in which an oxide semiconductor layer containing nitrogen is used for a channel region.

At least one of a first electrode and a second electrode of the light-emitting element is formed using a conductive film that transmits visible light, and light emission is extracted from the light-emitting element. When attention is focused on the direction in which light emission is extracted, the following structures can be given: a top emission structure in which light emission is extracted from the side of a substrate provided with a light-emitting element without passing through the substrate provided with the light-emitting element and a transistor; a bottom emission structure in which light is emitted from the side where the light-emitting element is not formed through the substrate provided with the light-emitting element; and a dual emission structure in which light emission is extracted from both the side of the substrate provided with the light-emitting element and the other side of the substrate through the substrate. The pixel configuration illustrated in FIG. 8C can be applied to a light-emitting element having any of these emission structures.

A light-emitting element having a bottom emission structure will be described with reference to FIG. 9A. The light-emitting element having a bottom emission structure emits light in the direction indicated by an arrow in FIG. 9A.

In FIG. 9A, an example in which the n-channel transistor 111 described in Embodiment 1 is used as the light-emitting element driving transistor 7011 is illustrated; however, there is no particular limitation.

In FIG. 9A, an EL layer 7014, a second electrode 7015, and a protective film 7016 are stacked in this order over a first electrode 7017 having a light-transmitting property, which is electrically connected to a source electrode layer or a drain electrode layer of the light-emitting element driving transistor 7011.

The first electrode 7017 is formed using a conductive film that transmits visible light. For the conductive film that transmits visible light, for example, indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used. Further, a metal thin film having a thickness enough to transmit light (preferably approximately 5 nm to 30 nm) can also be used. For example, an aluminum film with a thickness of 20 nm can be stacked over another conductive film having a light-transmitting property.

For the second electrode 7015, a material which efficiently reflects light emitted from the EL layer 7014 is preferably used, in which case the light extraction efficiency can be improved. Note that the second electrode 7015 may have a stacked-layer structure. For example, a conductive film that transmits visible light, which is formed on the EL layer 7014, and a light-blocking film may be stacked on the conductive film. As the light-blocking film, although a metal film or the like which efficiently reflects light emitted from the EL layer is preferable, a resin or the like to which a black pigment is added can also be used, for example.

Note that one of the first electrode 7017 and the second electrode 7015 functions as an anode, and the other functions as a cathode. It is preferable to use a substance having a high work function for the electrode which functions as an anode, and a substance having a low work function for the electrode which functions as a cathode.

As a material having a high work function, for example, ZrN, Ti, W, Ni, Pt, Cr, ITO, or IZO (registered trademark) can be used. As a material having a low work function, an alkali metal such as Li or Cs, an alkaline earth metal such as Mg, Ca, or Sr, an alloy including any of these (such as Mg:Ag or Al:Li), a rare earth metal such as Yb or Er, or the like can be used.

Note that when power consumption is compared, it is preferable that the first electrode 7017 functions as a cathode and the second electrode 7015 functions as an anode because an increase in voltage of a driver circuit portion can be suppressed and power consumption can be reduced.

The EL layer 7014 includes at least the light-emitting layer and may be either a single layer or a stack of plural layers. As the structure in which a plurality of layers is stacked, a structure in which a hole-injection layer, a hole-transport layer, a light-emitting layer, an electron-transport layer, and an electron-injection layer are stacked in this order from an anode side can be given as an example. Note that not all of these layers except the light-emitting layer are necessarily provided in the EL layer 7014. Further, each of these layers may be provided in duplicate or more. Specifically, in the EL layer 7014, a plurality of light-emitting layers may be overlapped each other or another hole injection layer may overlap the electron injection layer. Furthermore, another component such as an electron-relay layer may be added as appropriate as an intermediate layer, in addition to a charge generation layer.

A light-emitting element 7012 is provided with a partition wall 7019 to cover a portion of the first electrode 7017. As the partition wall 7019, an inorganic insulating film or an organic polysiloxane film can be applied in addition to an organic resin film of polyimide, acrylic, polyamide, epoxy, or the like. It is particularly preferable that the partition wall 7019 be formed using a photosensitive resin material so that a side surface of the partition wall 7019 be formed as a tilted surface with a continuous curvature. In the case where a photosensitive resin material is used for the partition wall 7019, a step of forming a resist mask can be omitted. Further, the partition wall can be formed using an inorganic insulating film. When the inorganic insulating film is used for the partition wall, the amount of moisture included in the partition wall can be reduced.

Note that a color filter layer 7033 is provided between the light-emitting element 7012 and a substrate 7010 (see FIG. 9A). A structure for emitting white light is employed for the light-emitting element 7012, whereby light emitted from the light-emitting element 7012 passes through the color filter layer 7033 and then passes through an insulating layer 7031, a gate insulating layer 7030, and the substrate 7010 so as to be emitted to the outside.

Plural kinds of the color filter layer 7033 may be formed. For example, a red color filter layer, a blue color filter layer, a green color filter layer, or the like can be provided in each pixel. Note that the color filter layer 7033 is formed by a droplet discharge method such as an inkjet method, a printing method, an etching method using a photolithography technique, or the like.

The color filter layer 7033 is covered with an overcoat layer 7034 and a protective insulating layer 7035 is further formed thereover. Note that the overcoat layer 7034 having a small is illustrated in FIG. 9A; the overcoat layer 7034 is formed using a resin material such as an acrylic resin and has a function of reducing unevenness due to the color filter layer 7033.

A contact hole which is formed in the insulating layer 7031, an insulating layer 7032, the color filter layer 7033, the overcoat layer 7034, and the protective insulating layer 7035 and reaches the drain electrode layer is in a position which overlaps with the partition wall 7019.

Next, a light-emitting element having a dual emission structure will be described with reference to FIG. 9B. The light-emitting element having a dual emission structure emits light in the directions indicated by arrows in FIG. 9B.

In FIG. 9B, an example in which the n-channel transistor 111 described in Embodiment 1 is used as the light-emitting element driving transistor 7021 is illustrated; however, there is no particular limitation.

In FIG. 9B, an EL layer 7024 and a second electrode 7025 are stacked in this order over a first electrode 7027 having a light-transmitting property, which is electrically connected to a source electrode or a drain electrode of the light-emitting element driving transistor 7021.

The first electrode 7027 and the second electrode 7025 are each formed using a conductive film that transmits visible light. The material which can be used for the first electrode 7017 in FIG. 9A can be used for the conductive film that transmits visible light. Thus, the description of the first electrode 7017 is referred to for the details.

Note that one of the first electrode 7027 and the second electrode 7025 functions as an anode, and the other functions as a cathode. It is preferable to use a substance having a high work function for the electrode which functions as an anode, and a substance having a low work function for the electrode which functions as a cathode.

The EL layer 7024 may be formed using a single layer or by stacking a plurality of layers. As for the EL layer 7024, the structure and material which can be used in FIG. 9A for the EL layer 7014 can be used. Thus, the description of the EL layer 7014 is referred to for the details.

A light-emitting element 7022 is provided with a partition wall 7029 to cover an edge of the first electrode 7027. As for the partition wall 7029, the structure and material which can be used for the partition wall 7019 in FIG. 9A can be used. Thus, the description of the partition wall 7019 is referred to for the details.

In addition, in the element structure illustrated in FIG. 9B, light is emitted from the light-emitting element 7022 to both the second electrode 7025 side and the first electrode 7027 side as indicated by arrows, and light emitted to the first electrode 7027 side passes through an insulating layer 7041, an insulating layer 7042, a gate insulating layer 7040, and a substrate 7020 so as to be emitted to the outside.

In the structure in FIG. 9B, for performing full-color display, the light-emitting element 7022, one of light-emitting elements adjacent to the light-emitting element 7022, and the other of the light-emitting elements are, for example, a green light-emitting element, a red light-emitting element, and a blue light-emitting element, respectively. Alternatively, a light-emitting display device capable of full color display may be manufactured using four kinds of light-emitting elements which include a white light-emitting element in addition to three kinds of light-emitting elements.

Next, a light-emitting element having a top emission structure will be described with reference to FIG. 9C. The light-emitting element having a top emission structure emits light in the direction indicated by arrows in FIG. 9C.

In FIG. 9C, an example in which the n-channel transistor 111 described in Embodiment 1 is used as the light-emitting element driving transistor 7001 is illustrated; however, there is no particular limitation.

In FIG. 9C, an EL layer 7004 and a second electrode 7005 are stacked in this order over a first electrode 7003 which is electrically connected to a source electrode layer or a drain electrode layer of the light-emitting element driving transistor 7001.

As for the first electrode 7003, a material which efficiently reflects light emitted from the EL layer 7004 is preferably used, in which case the light extraction efficiency can be improved. Note that the first electrode 7003 may have a stacked-layer structure. For example, a conductive film that transmits visible light, which is formed on the side in contact with the EL layer 7004, may be stacked over a light-blocking film. As the light-blocking film, although a metal film or the like which efficiently reflects light emitted from the EL layer is preferable, a resin or the like to which a black pigment is added can also be used, for example.

The second electrode 7005 is formed using a conductive film that transmits visible light. The material which can be used for the first electrode 7017 in FIG. 9A can be used for the conductive film that transmits visible light. Thus, the description of the first electrode 7017 is referred to for the details.

Note that one of the first electrode 7003 and the second electrode 7005 functions as an anode, and the other functions as a cathode. It is preferable to use a substance having a high work function for the electrode which functions as an anode, and a substance having a low work function for the electrode which functions as a cathode.

The EL layer 7004 may be formed using a single layer or by stacking a plurality of layers. As for the EL layer 7004, the structure and material which can be used in FIG. 9A for the EL layer 7014 can be used. Thus, the description of the EL layer 7014 is referred to for the details.

A light-emitting element 7002 is provided with a partition wall 7009 to cover a portion of the first electrode 7003. As for the partition wall 7009, the structure and material which can be used for the partition wall 7019 in FIG. 9A can be used. Thus, the description of the partition wall 7019 is referred to for the details.

In FIG. 9C, the source electrode layer or the drain electrode layer of the light-emitting element driving transistor 7001 is electrically connected to the first electrode 7003 through a contact hole provided in a protective insulating layer 7052 and an insulating layer 7055. A planarization insulating layer 7053 can be formed using a resin material such as polyimide, acrylic, benzocyclobutene, polyamide, or epoxy. Other than such resin materials, a low-dielectric constant material (a low-k material), a siloxane-based resin, or the like can be used. Note that the planarization insulating layer 7053 may be formed by stacking a plurality of insulating films formed using these materials. There is no particular limitation on the method for forming the planarization insulating layer 7053, and the planarization insulating layer 7053 can be formed, depending on the material, by a sputtering method, an SOG method, spin coating, dip coating, spray coating, a droplet discharge method (such as an inkjet method, screen printing, or offset printing), or the like.

In the structure in FIG. 9C, for performing full-color display, the light-emitting element 7002, one of light-emitting elements adjacent to the light-emitting element 7002, and the other of the light-emitting elements are, for example, a green light-emitting element, a red light-emitting element, and a blue light-emitting element, respectively. Alternatively, a light-emitting display device capable of full color display may be manufactured using four kinds of light-emitting elements which include a white light-emitting element in addition to three kinds of light-emitting elements.

In the structure in FIG. 9C, a light-emitting display device capable of full color display may be manufactured in such a way that all of a plurality of light-emitting elements which is arranged is white light-emitting elements and a sealing substrate having a color filter or the like is arranged above the light-emitting element 7002. A material which exhibits a single color such as white is formed and combined with a color filter or a color conversion layer, whereby full color display can be performed.

Needless to say, display of single color light emission may also be performed. For example, a lighting device may be formed with the use of white light emission, or an area-color light-emitting device may be formed with the use of single color light emission.

If necessary, an optical film such as a polarizing film including a circularly polarizing plate may be provided.

Note that an example is described in which a transistor that controls the driving of a light-emitting element (a light-emitting element driving transistor) is electrically connected to the light-emitting element; however, a structure may be employed in which a current controlling transistor is connected between the light-emitting element driving transistor and the light-emitting element.

The semiconductor device described in this embodiment is not limited to the structures illustrated in FIGS. 9A to 9C and can be modified in various ways based on the spirit of techniques of the present invention.

(Embodiment 5)

A semiconductor device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone (also referred to as a cellular phone or a mobile phone device), a portable game machine, a portable information terminal, an audio reproducing device, and a large-sized game machine such as a pachinko machine. Examples of electronic devices each including the display device described in the above embodiment will be described.

Figure 10A:
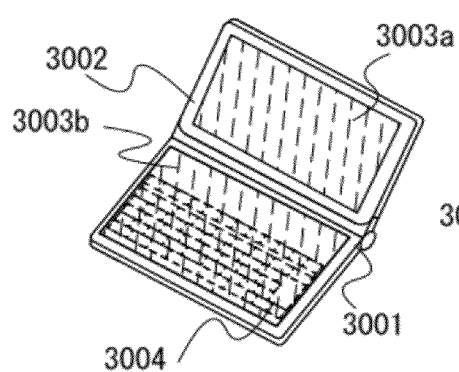
FIGS. 10A to 10D each illustrate one embodiment of an electronic appliance.

FIG. 10A illustrates a portable information terminal, which includes a main body 3001, a housing 3002, display portions 3003a and 3003b, and the like. The display portion 3003b is a panel having a touch-input function. By touching keyboard buttons 3004 displayed on the display portion 3003b, a screen can be operated and text can be input. Needless to say, the display portion 3003a may be a panel having a touch-input function. The liquid crystal panel or the organic light-emitting panel described in Embodiment 4 is manufactured using the transistor 111 described in Embodiments 1 as a switching element and applied to the display portion 3003a or 3003b, whereby the portable information terminal can be obtained.

The portable information terminal illustrated in FIG. 10A can have a function of displaying various kinds of information (e.g., a still image, a moving image, and a text image); a function of displaying a calendar, the date, the time, and the like on the display portion; a function of operating or editing the information displayed on the display portion; a function of controlling processing by various kinds of software (programs); and the like. Furthermore, an external connection terminal (an earphone terminal, a USB terminal, or the like), a storage medium insertion portion, and the like may be provided on the back surface or the side surface of the housing.

The portable information terminal illustrated in FIG. 10A may transmit and receive data wirelessly. Through wireless communication, desired book data or the like can be purchased and downloaded from an electronic book server.

Figure 10B:
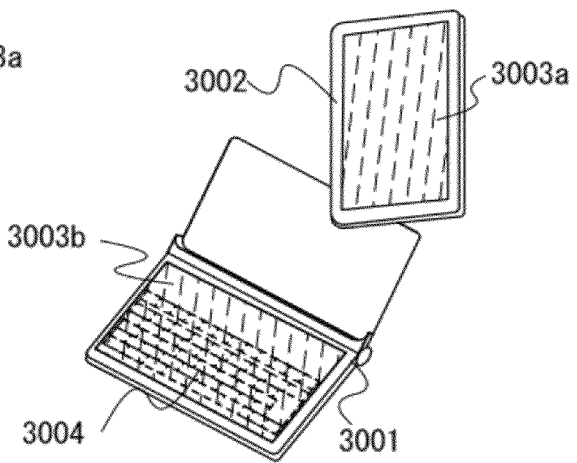

Further, one of the two display portions 3003a and 3003b of the portable information terminal illustrated in FIG. 10A can be detached as illustrated in FIG. 10B. The display portion 3003a can be a panel having a touch-input function, which contributes to a further reduction in weight when it is carried around and to the convenience since operation can be performed by one hand with the housing 3002 supported by the other hand.

Further, the housing 3002 illustrated in FIG. 10B may be equipped with an antenna, a microphone function, or a wireless transmission function to be used as a mobile phone.

Figure 10C:
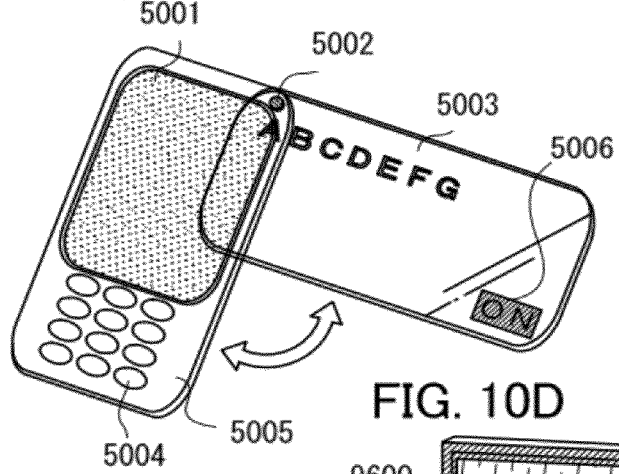

FIG. 10C illustrates an example of a mobile phone. A mobile phone 5005 illustrated in FIG. 10C is provided with a display portion 5001 incorporated in a housing, a display panel 5003 attached to a hinge 5002, operation buttons 5004, a speaker, a microphone, and the like.

In the mobile phone 5005 illustrated in FIG. 10C, the display panel 5003 is slid to overlap the display portion 5001, and the display panel 5003 also functions as a cover having a light-transmitting property. The display panel 5003 is a display panel including the light-emitting element having a dual emission structure illustrated in FIG. 9B in Embodiment 4, in which light emission is extracted through the surface opposite to the substrate side and the surface on the substrate side.

Since the light-emitting element having a dual emission structure is used for the display panel 5003, display can be performed also with the display portion 5001 overlapped; therefore, both the display portion 5001 and the display panel 5003 can perform display and the users can view both the displays. The display panel 5003 has a light-transmitting property and the view beyond the display panel can be seen. For example, when a map is displayed on the display portion 5001 and the location points of users are displayed using the display panel 5003, the present location can be recognized easily.

Further, in the case where the mobile phone 5005 is provided with an image sensor to be used as a television telephone, it is possible to make conversation with plural persons while their faces are displayed; therefore, a television conference or the like can be performed. For example, when the face of a single person or the faces of plural persons are displayed on the display panel 5003 and further the face of another person is displayed on the display portion 5001, users can make conversation while viewing the faces of two or more persons.

When a touch input button 5006 displayed on the display panel 5003 is touched with a finger or the like, data can be inputted into the mobile phone 5005. In addition, operations such as making calls and composing mails can be conducted by sliding the display panel 5003 and touching the operation buttons 5004 with a finger or the like.

Figure 10D:
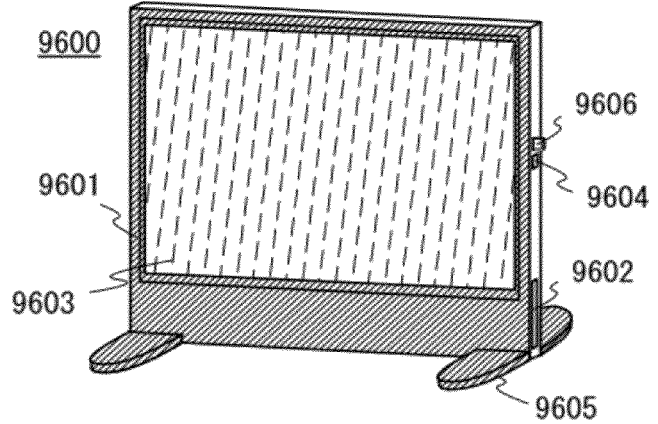

FIG. 10D illustrates an example of a television set. In a television set 9600, a display portion 9603 is incorporated in a housing 9601. The display portion 9603 can display images. Here, the housing 9601 is supported on a stand 9605 incorporating a CPU. When the transistor 111 described in Embodiment 1 is applied to the display portion 9603, the television set 9600 can be obtained.

The television set 9600 can be operated by an operation switch of the housing 9601 or a separate remote controller. Further, the remote controller may be provided with a display portion for displaying data output from the remote controller.

Note that the television set 9600 is provided with a receiver, a modem, and the like. With the use of the receiver, general television broadcasting can be received. Moreover, when the television set is connected to a communication network with or without wires via the modem, one-way (from a transmitter to a receiver) or two-way (between a transmitter and a receiver or between receivers) data communication can be performed.

Further, the television set 9600 is provided with an external connection terminal 9604, a storage medium recording and reproducing portion 9602, and an external memory slot. The external connection terminal 9604 can be connected to various types of cables such as a USB cable, and data communication with a personal computer or the like is possible. A disk storage medium can be inserted into the storage medium recording and reproducing portion 9602, and reading data stored in the storage medium and writing data into the storage medium can be performed. In addition, a picture, a video, or the like stored as data in an external memory 9606 inserted into the external memory slot can be displayed on the display portion 9603.

The methods, structures, and the like described in this embodiment can be combined as appropriate with any of the methods, structures, and the like described in the other embodiments.

EXAMPLE 1

Samples were formed in such a manner that oxide semiconductor layers each having a thickness of 100 nm were deposited over their respective quartz substrates under different deposition conditions (eight conditions), and the samples were analyzed with an ellipsometer.

The deposition conditions were as follows: the substrate temperature was 400° C., a target having a composition ratio of $In_2O_3:Ga_2O_3:ZnO=1:1:2$ [molar ratio] was used, and eight kinds of gas flow rates were used. Samples were manufactured under the following eight kinds of deposition conditions: a deposition condition at an oxygen gas flow rate of 40 sccm, a deposition condition at an oxygen gas flow rate of 20 sccm and a nitrogen gas flow rate of 20 sccm, a deposition condition at an oxygen gas flow rate of 15 sccm and a nitrogen gas flow rate of 25 sccm, a deposition condition at an oxygen gas flow rate of 10 sccm and a nitrogen gas flow rate of 30 sccm, a deposition condition at an oxygen gas flow rate of 7 sccm and a nitrogen gas flow rate of 33 sccm, a deposition condition at an oxygen gas flow rate of 5 sccm and a nitrogen gas flow rate of 35 sccm, a deposition condition at an oxygen gas flow rate of 3 sccm and a nitrogen gas flow rate of 37 sccm, and a deposition condition at a nitrogen gas flow rate of 40 sccm.

Figure 11:
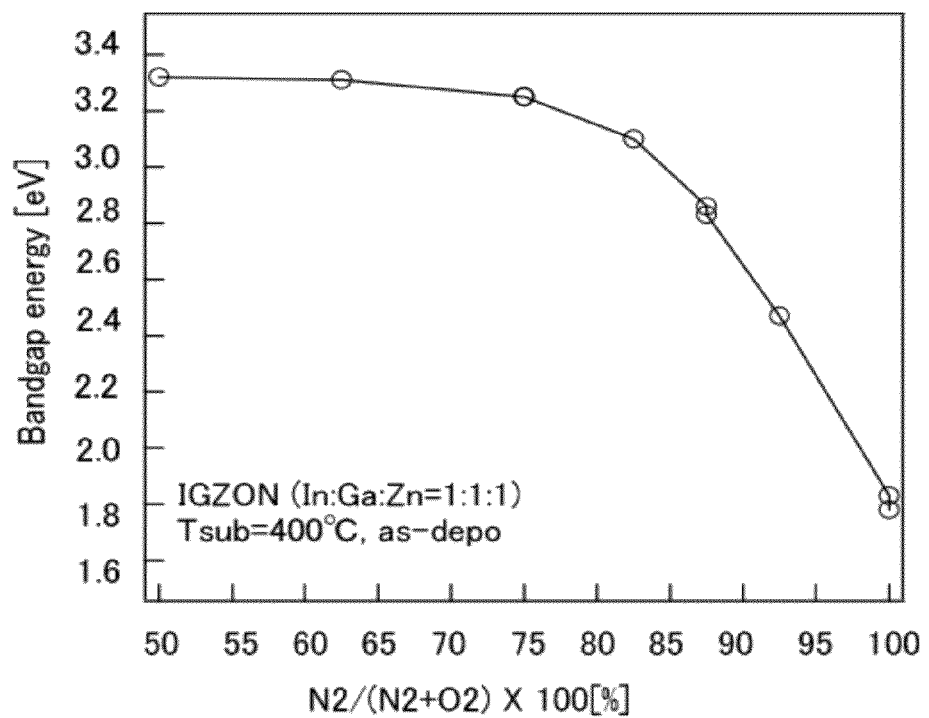
FIG. 11 is a graph showing gas flow rate dependency of the band gap of an oxide semiconductor layer.

Optical band gaps of the samples obtained under the eight kinds of deposition conditions, which were obtained by the analysis with an ellipsometer, were each measured. FIG. 11 is a graph showing gas flow rate dependency of the band gap of the oxide semiconductor layer.

In addition, oxide semiconductor layers each having a thickness of 15 nm were deposited under the above deposition conditions (eight conditions) over their respective n-type silicon wafers to form samples, and the nitrogen concentrations in the oxide semiconductor layers were measured with XPS.

Figure 12:
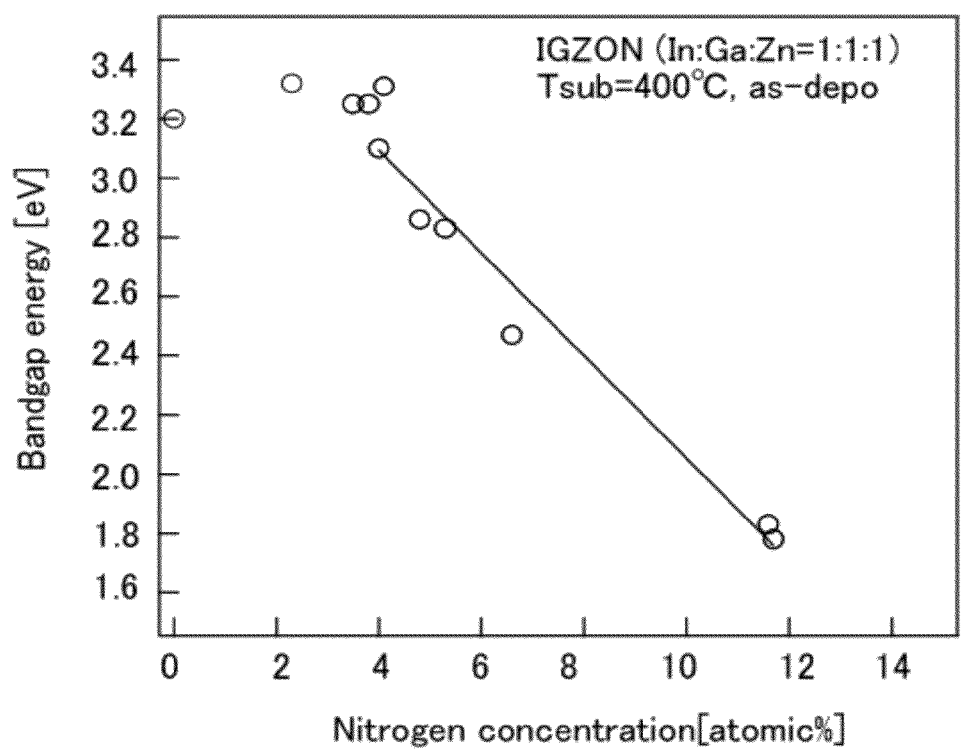
FIG. 12 is a graph showing nitrogen concentration dependency of the band gap of an oxide semiconductor layer.

FIG. 12 is a graph showing nitrogen concentration dependency of the band gap of the oxide semiconductor layer. It can be found from FIG. 12 that the band gap hardly varies when the nitrogen concentration of the oxide semiconductor layer is lower than 4 atomic %, and the band gap tends to decrease in a linear shape when the nitrogen concentration of the oxide semiconductor layer exceeds 4 atomic %. Note that the nitrogen concentration of the oxide semiconductor layer is 4 atomic % under deposition condition of an oxygen gas flow rate of 7 sccm and a nitrogen gas flow rate of 33 sccm.

Figure 13:
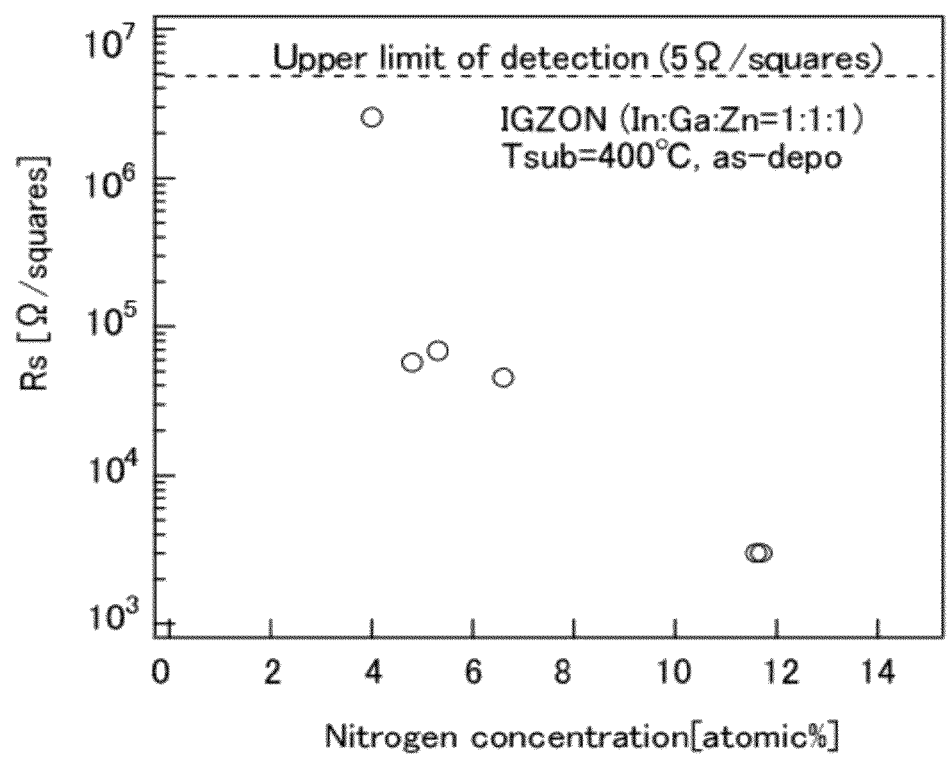
FIG. 13 is a graph showing nitrogen concentration dependency of sheet resistance of an oxide semiconductor layer.

Further, sheet resistance of the oxide semiconductor layer was measured. FIG. 13 is a graph showing nitrogen concentration dependency of the sheet resistance of the film. It can be found from FIG. 13 that when the nitrogen concentration of the oxide semiconductor layer is higher than or equal to 4 atomic %, the value of the sheet resistance is largely reduced in proportion to the nitrogen concentration. Note that the value of the sheet resistance in the case where the nitrogen concentration of the oxide semiconductor layer is lower than 4 atomic % could not be measured because it exceeded the upper limit of detection.

Figure 14:
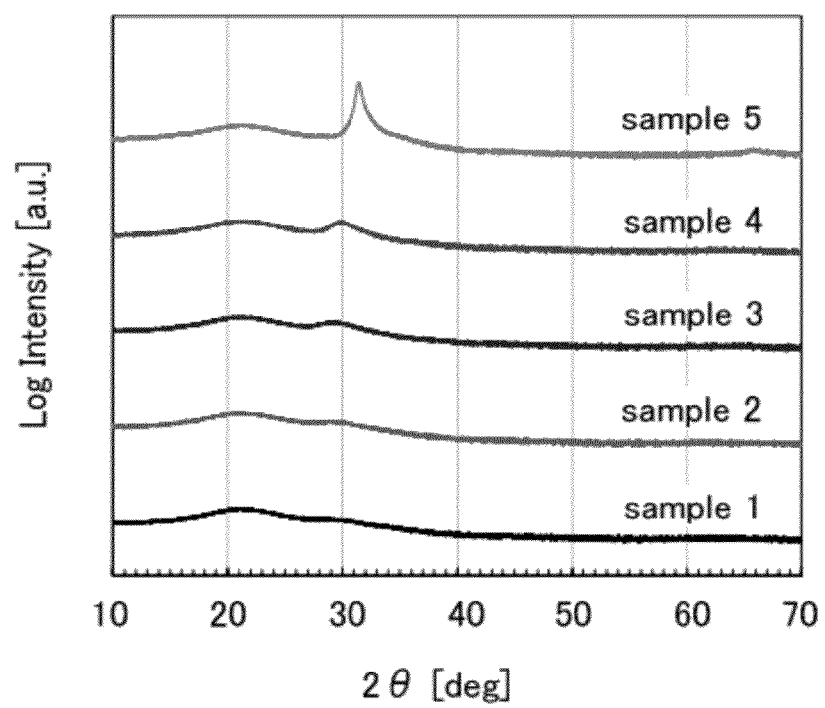
FIG. 14 is a graph showing results of XRD analysis of an oxide semiconductor layer.

FIG. 14 shows results of XRD analysis. Sample 1 was deposited under a condition that the proportion of an $N_2$ gas flow rate was 75%, and the nitrogen concentration in the film was 3.5 atomic %. Sample 2 was deposited under a condition that the proportion of an $N_2$ gas flow rate was 82.5%, and the nitrogen concentration in the film was 4 atomic %. Sample 3 was deposited under a condition that the proportion of an $N_2$ gas flow rate was 87.5%, and the nitrogen concentration in the film was 4.8 atomic %. Sample 4 was deposited under a condition that the proportion of an $N_2$ gas flow rate was 92.5%, and the nitrogen concentration in the film was 6.6 atomic %. Sample 5 was deposited under a condition that the proportion of an $N_2$ gas flow rate was 100%, and the nitrogen concentration in the film was 11.7 atomic %.

Note that the deposition condition in the case where the nitrogen gas flow rate is 40 sccm corresponds to that of Sample 5, and the nitrogen concentration in the oxide semiconductor layer is 11.7 atomic %.

It can be found from FIG. 14 that a peak around $2\theta=30°$ exhibiting crystallization at the gas flow rate ratio at which the band gap is largely lowered in FIG. 11 is large. In consideration of the above results, it can be found that the band gap, the sheet resistance, and the crystallinity correlate with the nitrogen concentration in the oxide semiconductor layer.

This application is based on Japanese Patent Application serial No. 2010-267906 filed with Japan Patent Office on Nov. 30, 2010, the entire contents of which are hereby incorporated by reference.

What is claimed is:

1. A semiconductor device comprising:
   a gate electrode layer;
   a first insulating layer in contact with the gate electrode layer;
   an oxide semiconductor layer in contact with the first insulating layer; and
   a second insulating layer in contact with the oxide semiconductor layer,
   wherein the oxide semiconductor layer has a wurtzite crystal structure and has a concentration gradient in which a nitrogen concentration is increased as a distance from the first insulating layer becomes shorter.

2. The semiconductor device according to claim 1, wherein the oxide semiconductor layer contains indium, gallium, and zinc.

3. The semiconductor device according to claim 1, wherein the first insulating layer contains nitrogen.

4. A semiconductor device comprising:
   a gate electrode layer;
   a first insulating layer in contact with the gate electrode layer;
   a first oxide semiconductor layer in contact with the first insulating layer;
   a second oxide semiconductor layer in contact with the first oxide semiconductor layer; and
   a second insulating layer in contact with the second oxide semiconductor layer,
   wherein the first oxide semiconductor layer and the second oxide semiconductor layer each have a wurtzite crystal structure, and
   wherein the first oxide semiconductor layer has a higher nitrogen concentration than the second oxide semiconductor layer.

5. The semiconductor device according to claim 4, wherein the nitrogen concentration of the first oxide semiconductor layer is higher than or equal to 0.1 atomic % and lower than 7 atomic %.

6. The semiconductor device according to claim 4, wherein the nitrogen concentration of the second oxide semiconductor layer is higher than or equal to $1\times10^{17}$ /cm$^3$ and lower than $5\times10^{19}$ /cm$^3$.

7. The semiconductor device according to claim 4, wherein the first oxide semiconductor layer and the second oxide semiconductor layer contain indium, gallium, and zinc.

8. The semiconductor device according to claim 4, wherein the first insulating layer contains nitrogen.

* * * * *